(12) United States Patent
Hsieh et al.

(10) Patent No.: US 11,824,017 B2
(45) Date of Patent: Nov. 21, 2023

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Wei-Kang Hsieh, Hsinchu (TW); Hao-Yi Tsai, Hsinchu (TW); Tin-Hao Kuo, Hsinchu (TW); Shih-Wei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/981,470

(22) Filed: Nov. 6, 2022

(65) Prior Publication Data
US 2023/0066410 A1    Mar. 2, 2023

Related U.S. Application Data

(63) Continuation of application No. 17/192,897, filed on Mar. 5, 2021, now Pat. No. 11,515,268.

(51) Int. Cl.
*H01L 23/31* (2006.01)
*H01L 23/00* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............... H01L 23/562; H01L 21/4853; H01L 21/4857; H01L 21/561; H01L 21/565; H01L 21/568; H01L 21/6835; H01L 23/3128; H01L 23/4006; H01L 23/5383; H01L 23/5386; H01L 24/96; H01L 25/0655; H01L 25/50; H01L 2023/4031;
(Continued)

(56) References Cited

U.S. PATENT DOCUMENTS

| 7,550,986 B2 * | 6/2009 | Kerber | G01R 31/2884 |
| | | | 324/762.05 |
| 8,707,237 B2 * | 4/2014 | Chen | G06F 30/398 |
| | | | 716/132 |

(Continued)

*Primary Examiner* — Vu A Vu
(74) *Attorney, Agent, or Firm* — JCIPRNET

(57) ABSTRACT

A semiconductor package has central region and peripheral region surrounding central region. The semiconductor package includes dies, encapsulant, and redistribution structure. The dies include functional die and first dummy dies. Functional die is disposed in central region. First dummy dies are disposed in peripheral region. Redistribution structure is disposed on encapsulant over the dies, and is electrically connected to functional die. Vacancy ratio of central region is in the range from 1.01 to 3.00. Vacancy ratio of the peripheral region is in the range from 1.01 to 3.00. Vacancy ratio of central region is a ratio of total area of central region to total area occupied by dies disposed in central region. Vacancy ratio of peripheral region is a ratio of total area of peripheral region to total area occupied by first dummy dies disposed in peripheral region.

20 Claims, 26 Drawing Sheets

(51) Int. Cl.
*H01L 23/538* (2006.01)
*H01L 21/683* (2006.01)
*H01L 21/48* (2006.01)
*H01L 21/56* (2006.01)
*H01L 25/00* (2006.01)
*H01L 23/40* (2006.01)
*H01L 25/065* (2023.01)

(52) U.S. Cl.
CPC .......... *H01L 21/561* (2013.01); *H01L 21/565* (2013.01); *H01L 21/568* (2013.01); *H01L 21/6835* (2013.01); *H01L 23/3128* (2013.01); *H01L 23/4006* (2013.01); *H01L 23/5383* (2013.01); *H01L 23/5386* (2013.01); *H01L 24/96* (2013.01); *H01L 25/0655* (2013.01); *H01L 25/50* (2013.01); *H01L 2023/405* (2013.01); *H01L 2023/4031* (2013.01); *H01L 2023/4087* (2013.01); *H01L 2221/68372* (2013.01); *H01L 2224/95001* (2013.01); *H01L 2924/3511* (2013.01)

(58) Field of Classification Search
CPC ....... H01L 2023/405; H01L 2023/4087; H01L 2221/68372; H01L 2224/95001; H01L 2924/3511
USPC .......................................................... 257/668
See application file for complete search history.

(56) References Cited

U.S. PATENT DOCUMENTS

| | | | |
|---|---|---|---|
| 8,779,599 B2* | 7/2014 | Lin | H01L 21/561 |
| | | | 257/725 |
| 8,987,915 B1* | 3/2015 | Yu | H01L 24/94 |
| | | | 257/773 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,093,337 B2* | 7/2015 | Hwang | H01L 21/568 |
| 9,111,949 B2 | 8/2015 | Yu et al. | |
| 9,224,697 B1* | 12/2015 | Kwon | H01L 24/94 |
| 9,240,398 B2* | 1/2016 | Fujimori | H01L 21/78 |
| 9,263,511 B2 | 2/2016 | Yu et al. | |
| 9,281,254 B2 | 3/2016 | Yu et al. | |
| 9,347,862 B2* | 5/2016 | Lynch | G01N 1/28 |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,613,931 B2* | 4/2017 | Lin | H01L 25/0652 |
| 9,728,470 B1* | 8/2017 | Heider | H01L 29/7786 |
| 10,937,749 B2* | 3/2021 | Shih | H01L 24/97 |
| 11,515,268 B2* | 11/2022 | Hsieh | H01L 21/4857 |

* cited by examiner

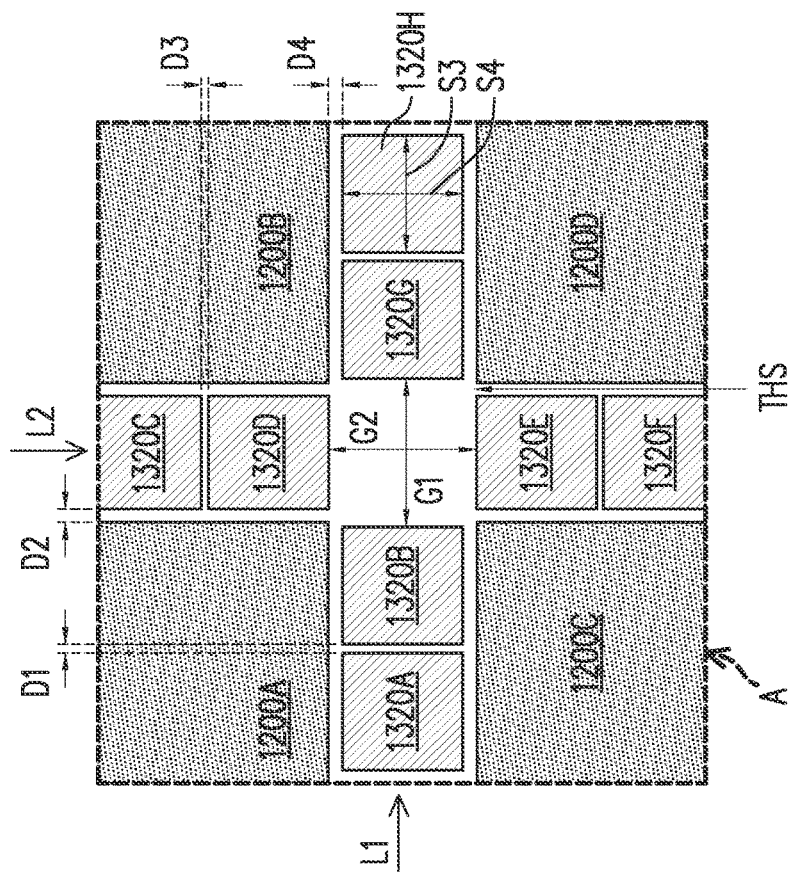
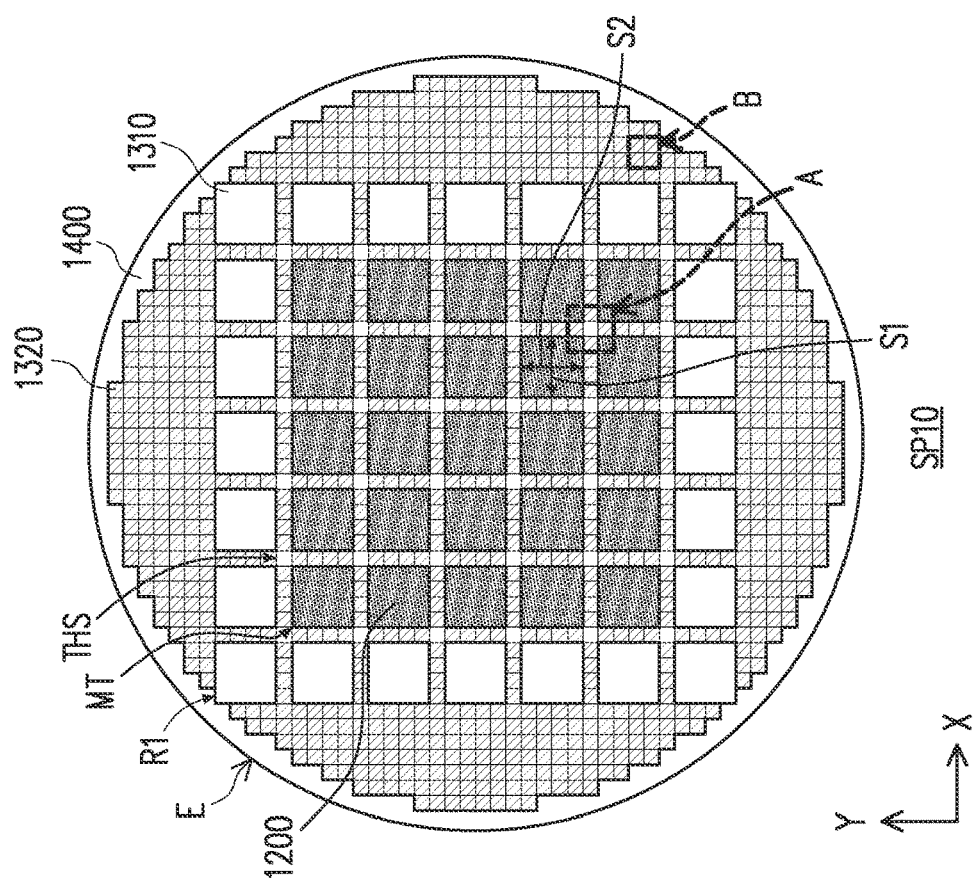
FIG. 3A
FIG. 3B

SEMICONDUCTOR PACKAGE AND MANUFACTURING METHOD THEREOF

CROSS-REFERENCE TO RELATED APPLICATION

This application is a continuation application of and claims the priority benefit of a prior application Ser. No. 17/192,897, filed on Mar. 5, 2021. The entirety of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1I are schematic cross-sectional views of structures produced at various stages of a manufacturing method of a semiconductor package according to some embodiments of the present disclosure.

FIG. 3A is a schematic cross-sectional view of a semiconductor package according to some embodiments of the present disclosure.

FIG. 3B and FIG. 3C are schematic cross-sectional views of portions of the semiconductor package of FIG. 3A according to some embodiments of the present disclosure.

DETAILED DESCRIPTION

Figure 1A:
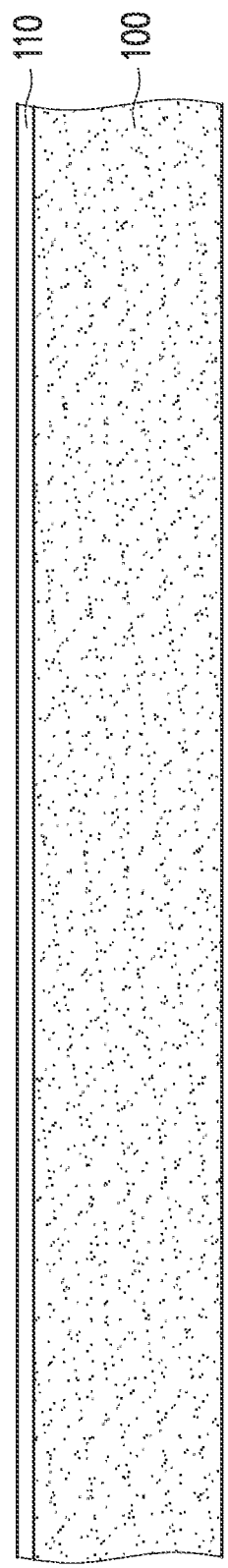

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1I are schematic cross-sectional views of structures produced at various stages of a manufacturing method of a semiconductor package SP1 according to some embodiments of the present disclosure. Referring to FIG. 1A, a carrier 100 is provided. In some embodiments, the carrier 100 is a glass substrate, a metal plate, a plastic supporting board, or the like, but other suitable substrate materials may be used as long as the materials are able to withstand the subsequent steps of the process. In some embodiments, a de-bonding layer (not shown) is provided on the carrier 100 to facilitate peeling the carrier 100 away from the structure when required by the manufacturing process. In some embodiments, the de-bonding layer includes a light-to-heat conversion (LTHC) release layer. In some embodiments, an adhesive layer 110 is formed on the carrier 100, for example via lamination. The adhesive layer 110 may include a die attach film material, such as a pressure adhesive, a thermally curable adhesive, or the like.

Figure 1B:
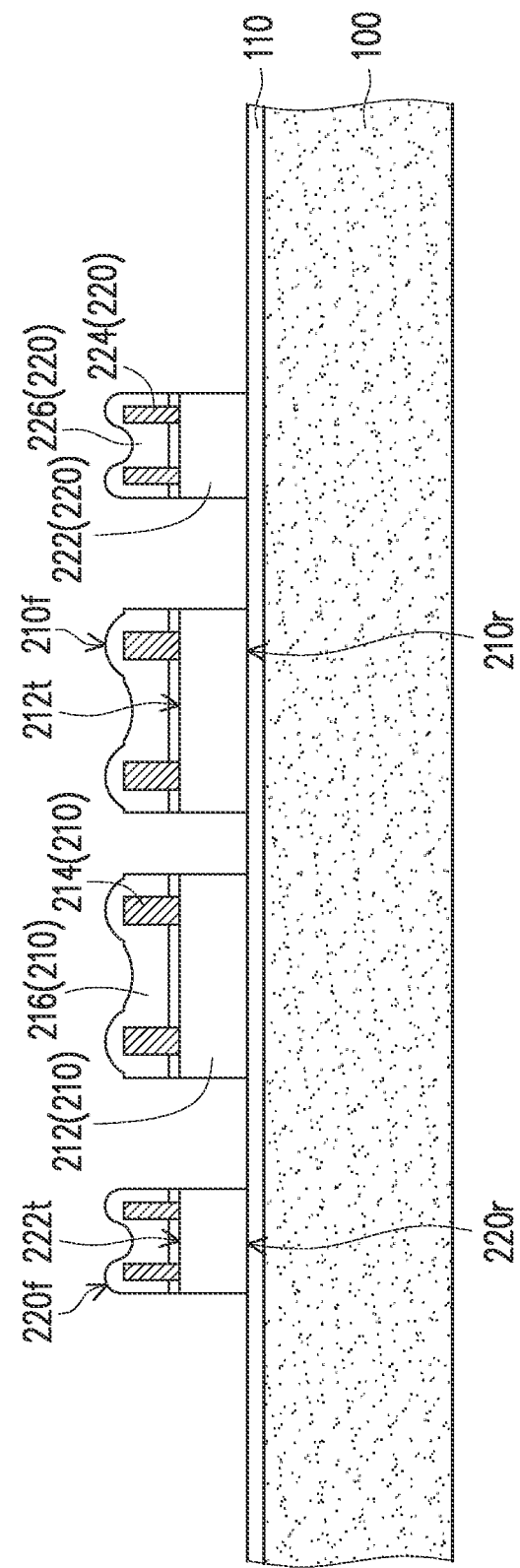

In some embodiments, referring to FIG. 1B, semiconductor dies 210, 220 are provided on the carrier 100. In some embodiments, the semiconductor dies 210, 220 are placed onto the carrier 100 through a pick-and-place method.

In some embodiments, an individual semiconductor die 210 includes a semiconductor substrate 212, contact pads 214, and a protective layer 216. The contact pads 214 are formed at the top surface 212t of the semiconductor substrate 212. The protective layer 216 covers the top surface 212t of the semiconductor substrate 212 left exposed by the contact pads 214. In some embodiments, the protective layer 216 further extends on portions of the contact pads 214.

The semiconductor substrate 212 may be made of semiconductor materials, such as semiconductor materials of the groups III-V of the periodic table. In some embodiments, the semiconductor substrate 212 include elemental semiconductor materials, such as crystalline silicon, diamond, or germanium; compound semiconductor materials such as silicon carbide, gallium arsenide, indium arsenide, or indium phosphide, or alloy semiconductor materials such as silicon germanium, silicon germanium carbide, gallium arsenic phosphide, or gallium indium phosphide. In some embodiments, the material of the contact pads 214 includes aluminum, copper, copper alloys, or other conductive materials, and may be formed by deposition, plating, or other suitable techniques. The protective layer 216 may be a single layer or a multi-layered structure, and may include silicon oxide, silicon nitride, silicon oxy-nitride, other suitable dielectric materials, or combinations thereof. The protective layer 216 may be formed by suitable fabrication techniques such as spin-on coating, chemical vapor deposition (CVD), or the like. In some embodiments, the protective layers 216 may cover the contact pads 214 and (temporarily) constitute the front surfaces 210f of the semiconductor dies 210.

The semiconductor dies 220 may have a similar structure as the one just described for the semiconductor dies 210. Briefly, each semiconductor die 220 may include a semiconductor substrate 222 having contact pads 224 formed on a top surface 222t, and a protective layer 226 covering the contact pads 224 and (temporarily) constituting the front surface 220f of the semiconductor die 220. In some embodiments, the semiconductor dies 220 may have a different shape (e.g., a different footprint) than the semiconductor dies 210. For example, the semiconductor dies 210 may have a square footprint, and the semiconductor dies 220 may have a rectangular footprint. However, the disclosure is not limited thereto.

In some embodiments, the semiconductor dies 210, 220 are placed over the carrier 100 with the front surfaces 210f, 220f facing away from the carrier 100. Corresponding rear surfaces 210r, 220r opposite to the front surfaces 210f may be directed towards (and, possibly, in contact with) the adhesive layer 110. Each semiconductor die 210, 220 may independently be or include a logic die, such as a central processing unit (CPU) die, a graphic processing unit (GPU) die, a micro control unit (MCU) die, an input-output (I/O) die, a baseband (BB) die, or an application processor (AP) die, an analog die, a photonic device, or the like. In some embodiments, some semiconductor dies 210, 220 may be memory dies, for example configured as dynamic random-access memories (DRAMs), resistive random-access memories (RRAMs), static random-access memories (SRAMs), magneto-resistive random-access memories (MRAMs), ferroelectric random-access memories (FRAMs), read-only memory (ROM) or the like. In some embodiments, some of the semiconductor dies 210, 220 may be or include passive devices, such as capacitors (e.g., multi-layer ceramic capacitors), integrated passive devices, inductors, resistors, filters, transformers, and the like. The disclosure is not limited by the type or number of semiconductor dies 210, 220.

Figure 1C:
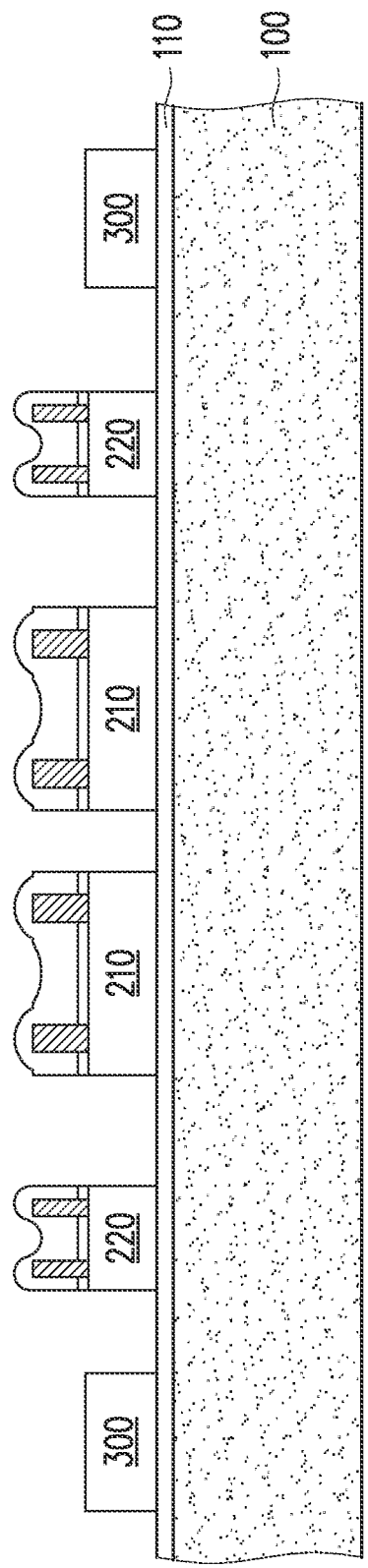

Referring to FIG. 1C, in some embodiments, dummy dies 300 are disposed over the carrier 100 beside the semiconductor dies 210, 220. In some embodiments, the dummy dies 300 are blocks including semiconductor materials, such as semiconductor materials of the groups III-V of the periodic table. In some alternative embodiments, the dummy dies 300 may include an inorganic material. In some embodiments, the inorganic material includes a metal such as copper or copper alloys, aluminum or aluminum alloys, or a combination thereof. In some embodiments, the inorganic material includes a ceramic material. In some embodiments, the inorganic material includes a glass material containing silicon oxide. The dummy dies 300 may be disposed among the semiconductor dies 210, 220. In some embodiments, dummy dies 300 of different shapes (e.g., differing footprints) may be disposed over the carrier 100.

Figure 1D:
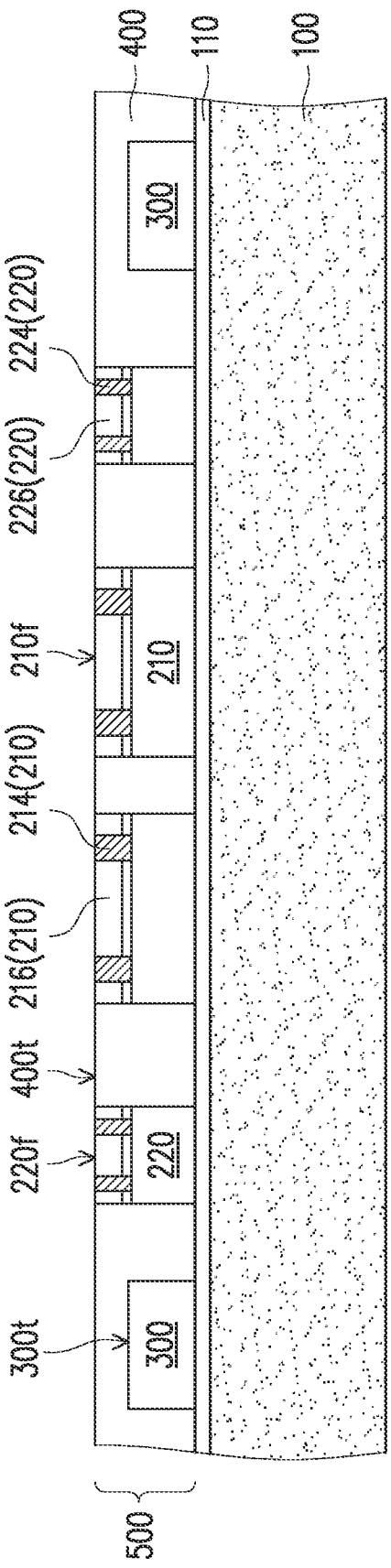

Referring to FIG. 1D, an encapsulant 400 is formed over the carrier 100. In some embodiments, the encapsulant 400 laterally encapsulates the semiconductor dies 210, 220. In some embodiments, the encapsulant 400 includes a molding compound, a molding underfill, a resin (such as an epoxy resin), or the like. In some embodiments, the encapsulant 400 is formed by an over-molding process. In some embodiments, the encapsulant 400 is formed by a compression molding process. In some embodiments, the encapsulant 400 may be initially formed so as to cover the front surfaces 210f, 220f (indicated, e.g., in FIG. 1B) of the semiconductor dies 210, 220. Thereafter, a portion of the encapsulant 400 is removed, for example by a planarization process, until the contact pads 214, 224 of the semiconductor dies 210, 220 are exposed. In some embodiments, portions of the protective layers 216, 226 are removed during the planarization process to expose the corresponding contact pads 214, 224. In some embodiments, the planarization of the encapsulant 400 includes performing a mechanical grinding process and/or a chemical mechanical polishing (CMP) process. Following planarization, the front surfaces 210f, 220f of the semiconductor chips 100 may be defined by the corresponding protective layers 216, 226 and contact pads 214, 224. That is, following the planarization step, the contact pads 214, 224 of the semiconductor chips 210, 220 are exposed and available for electrically connecting the semiconductor chips 210, 220 to subsequently formed components or elements. In some embodiments, the front surfaces 210f, 220f of the semiconductor chips 210, 220 exposing the contact pads 214, 224 are indicated as active surfaces. In some embodiments, the front surfaces 210f, 220f of the semiconductor chips 210, 220 may be substantially coplanar with the top surface 400t of the encapsulant 400. In some embodiments, the encapsulant 400 may cover the dummy dies 300. That is, the top surfaces 300t of the dummy dies 300 may be at a level height such that they remain buried within the encapsulant 400. In some embodiments, with formation of the encapsulant 400, a reconstructed wafer 500 is obtained.

Figure 1E:
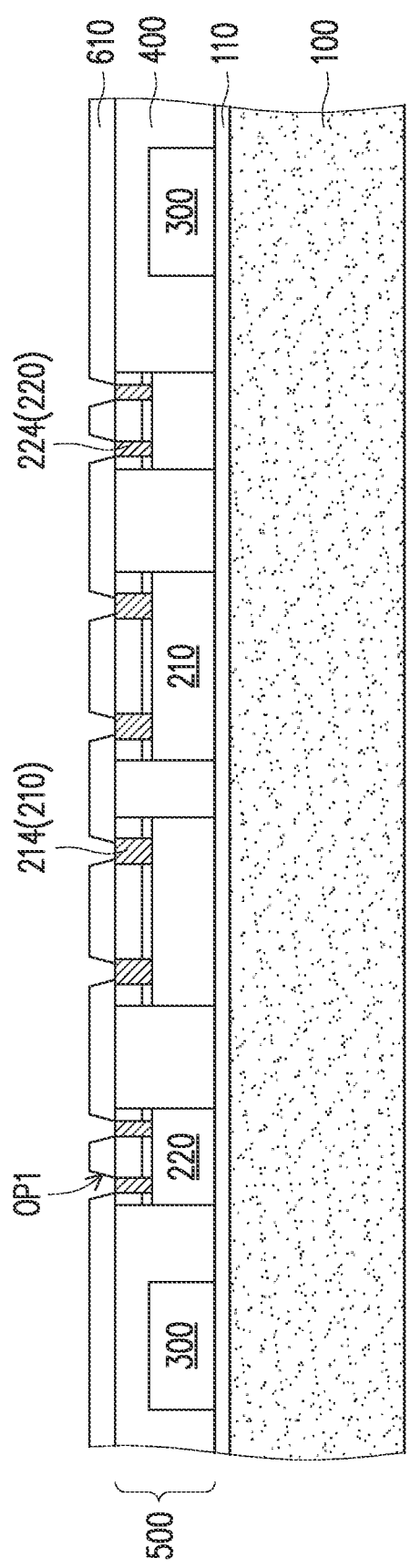

Referring to FIG. 1E, in some embodiments, a dielectric layer 610 is formed over the reconstructed wafer 500, on top of the encapsulant 400 and the semiconductor dies 210, 220.

In some embodiments, a material of the dielectric layer 610 includes polyimide, epoxy resin, acrylic resin, phenol resin, benzocyclobutene (BCB), polybenzooxazole (PBO), or any other suitable polymer-based dielectric material. In some embodiments, a precursor dielectric layer (not shown) may be blanketly formed on the reconstructed wafer 500, for example via spin-coating or suitable deposition techniques such as chemical vapor deposition (CVD), or the like. The precursor dielectric layer may be patterned, for example by etching in presence of an auxiliary mask (not shown), to form the dielectric layer 610 including openings OP1. The openings OP1 expose portions of the contact pads 214, 224 of the semiconductor dies 210, 220.

Figure 1F:
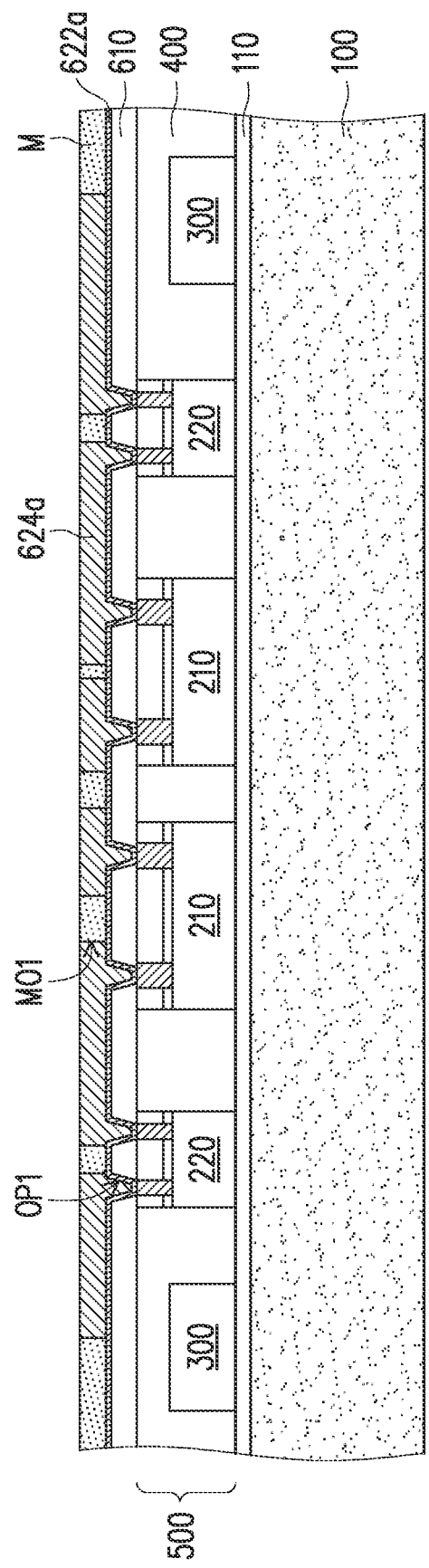

Referring to FIG. 1F, in some embodiments a seed precursor layer 622a is blanketly formed over the dielectric layer 610. In some embodiments, the seed precursor layer 622a is conformally formed over the dielectric layer 610, lining the openings OP1. In some embodiments, the seed precursor layer 622a establishes electrical contact with the contact pads 214, 224. The seed precursor layer 622a may be formed through, for example, a sputtering process, a physical vapor deposition (PVD) process, an atomic layer deposition (ALD) process, or the like. In some embodiments, the seed precursor layer 622a may include, for example, copper, tantalum, titanium, a combination thereof, or other suitable materials. In some embodiments, a barrier layer (not shown) may be deposited before forming the seed precursor layer 622a to prevent out-diffusion of the material of the seed precursor layer 622a and the subsequently formed conductive material 624a.

In some embodiments, a patterned mask M is provided on the seed precursor layer 622a, for example via a sequence of deposition, photolithography, and etching. In some embodiments, a material of the patterned mask M may include a positive photoresist or a negative photoresist. In some embodiments, the patterned mask M is patterned to include the mask openings MO1. The mask openings MO1 are formed in correspondence of the openings OP1. That is, the portions of the seed precursor layer 622a extending in the openings OP1 are exposed by the mask openings MO1, as well as portions of the seed precursor layer 622a extending on the dielectric layer 610 around the openings OP1. In some embodiments, a conductive material 624a may be formed on the portions of seed precursor layer 622a exposed by the mask openings MO1 of the patterned mask M. In some embodiments, the conductive material 624a fills the openings OP1 of the dielectric layer 610, and further extends over the dielectric layer 610 in the mask openings MOL. In some embodiments, the conductive material 624a may include copper, nickel, tin, palladium, gold, titanium, aluminum, or alloys thereof. In some embodiments, the conductive material 624a may be formed by a plating process. The plating process is, for example, electro-plating, electroless-plating, immersion plating, or the like.

Figure 1G:
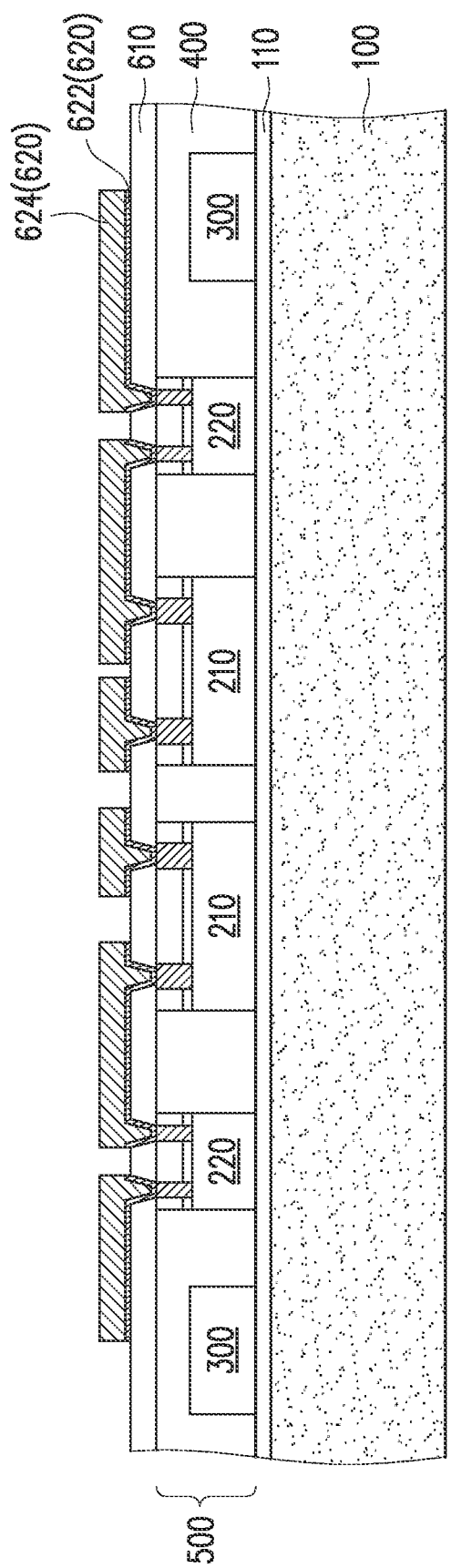

Referring to FIG. 1F and FIG. 1G, the patterned mask M and the underlying portions of seed precursor layer 622a may be removed. In some embodiments, the patterned mask M may be removed or stripped through, for example, etching, ashing, or other suitable removal processes. Upon removal of the patterned mask M, the portions of seed precursor layer 622a that are not covered by the conductive material 624a are removed to render the seed layer 622 and the conductive traces 624 of the metallization tier 620. The exposed portions of the seed precursor layer 622a may be removed, for example, through an etching process. In some embodiments, the conductive material 624a may be different from the material of the seed precursor layer 622a, so the portions of the seed precursor layer 622a exposed after removal of the patterned mask M may be removed through selective etching. In some embodiments, the conductive traces 624 may interconnect the semiconductor dies 210, 220. In some embodiments, the metallization tiers 620 may include additional metallic traces (not shown) forming seal rings, alignment marks, or the like.

Figure 1H:
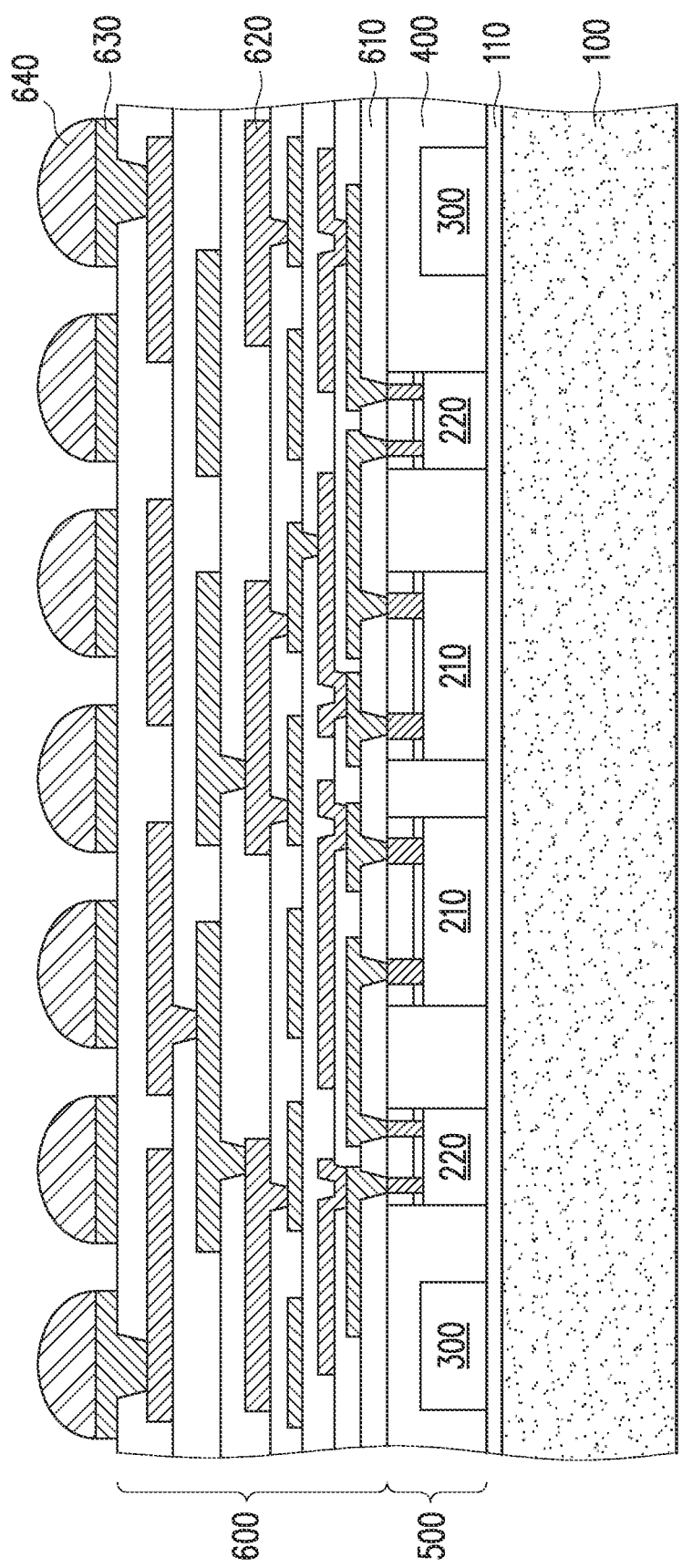

Referring to FIG. 1H, similar process steps to the ones just described with reference from FIG. 1E to FIG. 1G may be repeated to form the upper layers of the redistribution structure 600. As illustrated in FIG. 1H, the redistribution structure 600 includes stacked metallization tiers 620. Each metallization tiers 620 is disposed in between adjacent dielectric layers 610. Under-bump metallurgies 630 are optionally formed on the outermost dielectric layer 610 (the dielectric layer 610 further away from the reconstructed wafer 500). The under-bump metallurgies 630 may be conformally formed in the openings of the outermost dielectric layer 610 and further extend over portions of the exposed surface of the outermost dielectric layer 610. In some embodiments, the under-bump metallurgies 630 include multiple stacked layers. For example, the under-bump metallurgies 630 may include one or more metallic layers stacked on a seed layer. In some embodiments, connective terminals 640 are formed on the under-bump metallurgies 630. The connective terminals 640 may include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e.g., a metal pillar with a solder ball attached), or the like. In some embodiments, the connective terminals 640 are micro bumps. The connective terminals 640 are electrically connected to the semiconductor dies 210, 220 through the metallization tiers 620 of the redistribution structure 600. The dummy dies 300 may be electrically insulated from the redistribution structure 600 and the connective terminals 640. In some embodiments, the semiconductor dies 210, 220 connected to the redistribution structure 600 may be referred to as functional dies. As illustrated in FIG. 1H, portions of the encapsulant 400 may be interposed between the dummy dies 300 and the redistribution structure 600.

Referring to FIG. 1H and FIG. 1I, in some embodiments, the carrier 100 and the adhesive layer 110 may be removed to produce the semiconductor package SP1, a portion of which is shown in FIG. 1I. In some embodiments, the carrier 100 may be removed by irradiating the de-bonding layer (not shown), and the adhesive layer 110 may be removed by a wet clean process. In some embodiments, the semiconductor package SP1 includes the reconstructed wafer 500 having the redistribution structure 600 disposed thereon. While some cutting may be performed at the edges of the semiconductor package SP1, a singulation step may be omitted. That is, the semiconductor package SP1 may be a large-size semiconductor package. For example, the semiconductor package SP1 may be wafer-size semiconductor package. A wafer-size semiconductor package may have a circular footprint, with a diameter in the range from 150 mm to 300 mm. In some alternative embodiments, the semiconductor package SP1 may be a panel-size semiconductor package. The panel-size semiconductor package may have a rectangular footprint, for example with an area in the range from 300×300 mm$^2$ to 1000×1000 mm$^2$. In some yet alternative embodiments, the area of the semiconductor package SP1 may be in the range from 2500 mm$^2$ to 40000 mm$^2$. In some embodiments, the area of the semiconductor package SP1 may be greater than 10000 mm$^2$.

Based on the above, the semiconductor package SP1 includes a plurality of encapsulated dies. The dies may be functional dies, such as the semiconductor dies 210, 220, or dummy dies 300. The metallization tiers 620 of the redistribution structure 600 may establish directly electrical connection to the functional dies, while the dummy dies 300 may be electrically disconnected from the redistribution structure 600.

Figure 1J:
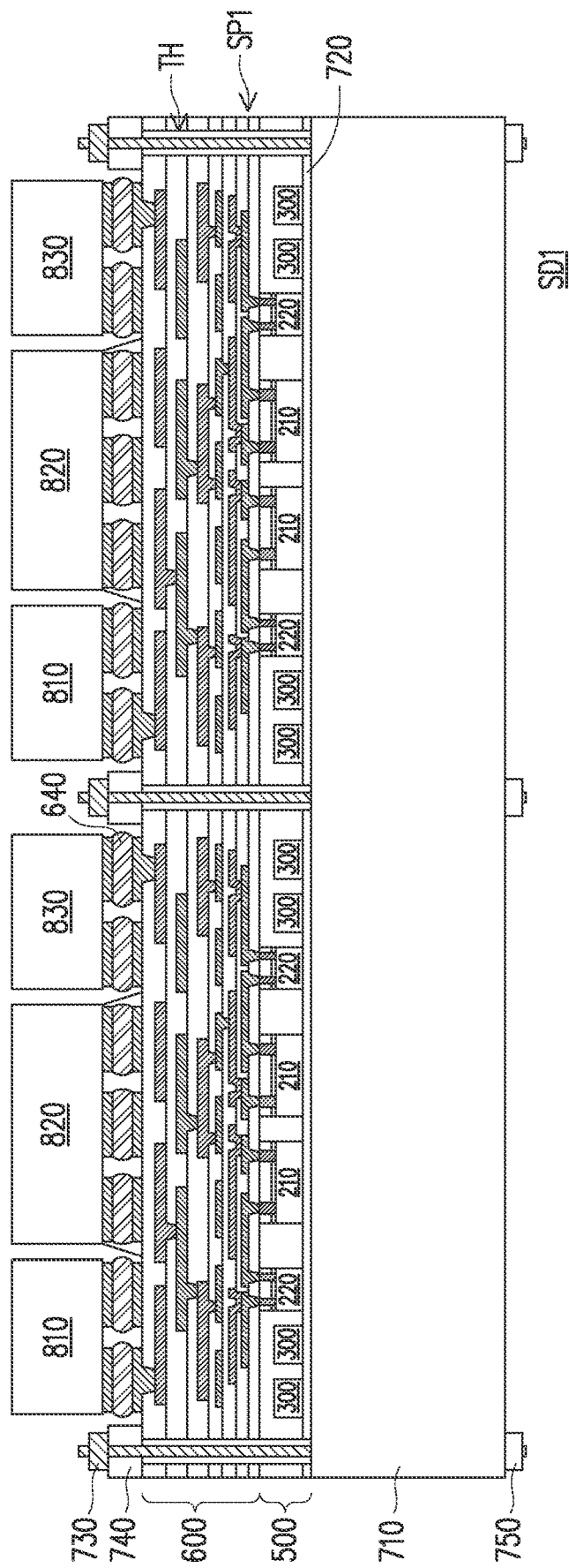
FIG. 1J is a schematic cross-sectional view of a semiconductor device according to some embodiments of the present disclosure.

In some embodiments, the semiconductor package SP1 may be integrated into larger devices, for example the semiconductor device SD1 illustrated in FIG. 1J. As illustrated in FIG. 1J, the semiconductor device SD1 includes the semiconductor package SP1 secured to a heat dissipation plate 710. The heat dissipation plate 710 may be disposed on an opposite side of the reconstructed wafer 500 with respect to the redistribution structure 600. A thermal interface layer 720 may be disposed in between the reconstructed wafer 500 and the heat dissipation plate 710. For example, the thermal interface layer 720 may contact the semiconductor dies 210, 220, and keep in thermal exchange the semiconductor dies 210, 220 and the heat dissipation plate 710. In some embodiments, the thermal interface layer 720 includes an adhesive material. In some embodiments, the thermal interface layer 720 includes grease-based materials, phase change materials, gels, adhesives, polymeric, metallic materials, or a combination thereof. In some embodiments, the thermal interface layer 720 includes lead-tin based solder (PbSn), silver paste (Ag), gold, tin, gallium, indium, or other suitable thermally conductive materials. Depending on the type of material used, the thermal interface layer 720 may be formed by deposition, lamination, printing, plating, or any other suitable technique. In some embodiments, the thermal interface layer 720 is a gel type material. In some embodiments, the thermal interface layer 720 is a film type material (e.g., carbon nanotubes or graphite).

In some embodiments, the heat dissipation plate 710 may be secured to the semiconductor package SP1 through fasteners. For example, through holes TH may be opened through the semiconductor package SP1, for example via laser drilling, and screws 730 may be inserted in the through holes TH to fix the heat dissipation plate 710 to the semiconductor package SP1. Braces 740 and nuts 750 may be additionally used to keep the screws 730 in place. However, the disclosure is not limited as to the fastening means used, and other types of fasteners (e.g., bolts, clamps, glue, etc.) may also be used.

As illustrated in FIG. 1J, additional dies and devices may be connected to the redistribution structure 600 of the semiconductor package SP1. For example, the connective terminals 640 may be used to establish electrical connection to plug connectors 810, additional packages 820, and passive devices 830 on the side of the redistribution structure 600 opposite with respect to the reconstructed wafer 500.

Figure 2A:
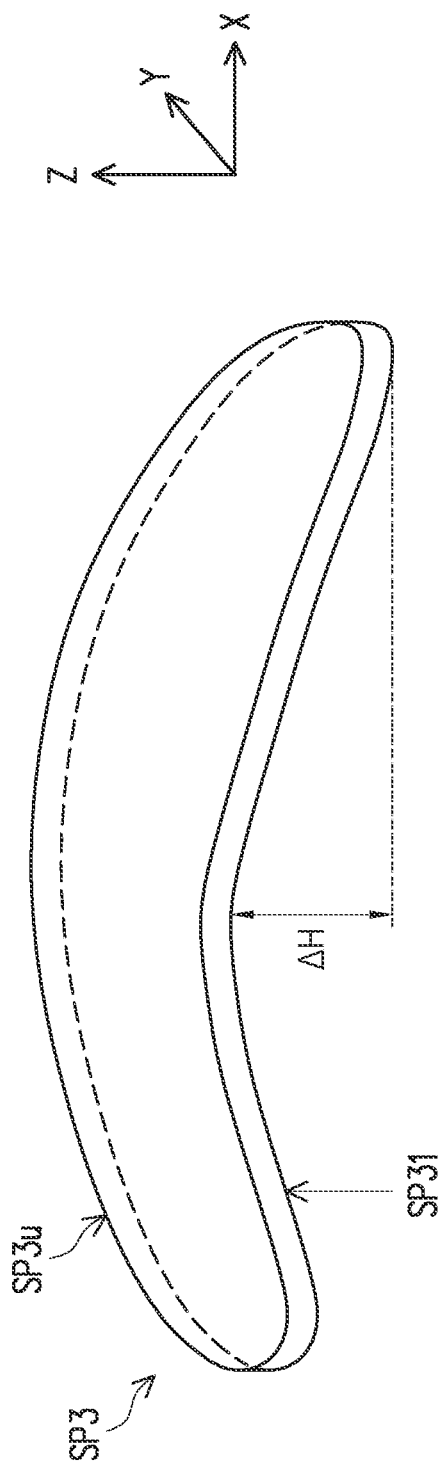
FIG. 2A and FIG. 2B are schematic perspective views of warped reconstructed wafers according to some embodiments of the present disclosure
Figure 2B:
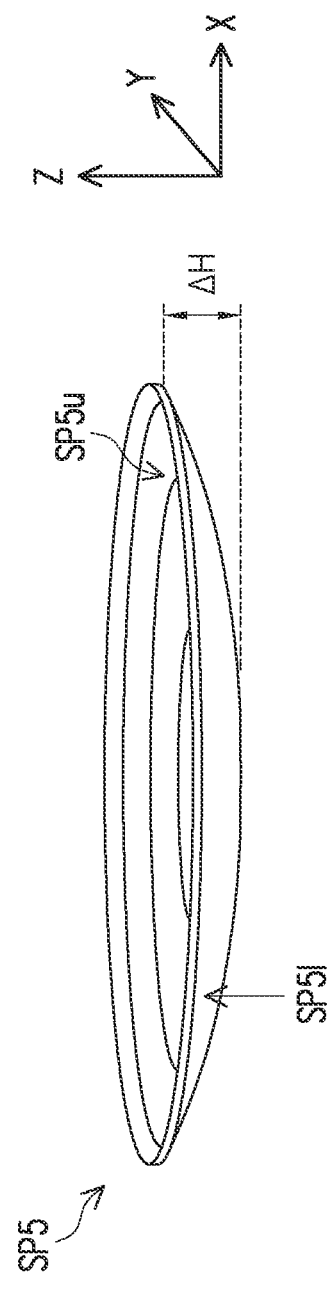

FIG. 2A and FIG. 2B are schematic perspective views of warped semiconductor packages SP3, SP5 according to some embodiments of the disclosure. For ease of reference, in FIG. 2A and FIG. 2B are illustrated also the axes X, Y, Z, of a set of orthogonal Cartesian coordinates. In some embodiments, the semiconductor packages SP3, SP5 may be large-size semiconductor packages, including similar components as described above for the semiconductor package SP1 of FIG. 1I. Referring to FIG. 1I, FIG. 2A, and FIG. 2B, in some embodiments, during manufacturing of the semiconductor packages SP1, SP3, SP5, heating steps may be required, for example for curing, soldering, reflowing, or the like. During these heating steps, the components included in the semiconductor packages SP1, SP3, SP5 may expand, each one according to its own coefficient of thermal expansion (CTE). For example, components made mostly of semiconductor materials (such as the semiconductor dies 210, 220) or metallic materials (such as the metallization tiers 620 or TIVs) may have a different thermal behavior than the dielectric materials (e.g., the encapsulant 400, or the dielectric layers 610 of the redistributions structure 600). As a result of this difference in thermal behavior, the semiconductor packages SP1, SP3, SP5 may become deformed, i.e., warped, along one or more directions. For example, as illustrated in FIG. 2A, the semiconductor package SP3 may undergo "saddle-type" warpage, bending towards the negative Z direction along the X direction, and bending towards the positive Z direction along the Y direction. In some alternative embodiments, as illustrated in FIG. 2B, the semiconductor package SP5 may undergo "potato-type" or "concentric-type" warpage. In these embodiments, the edges of the semiconductor package SP5 may deform in the Z direction with respect to the central region of the semiconductor package SP5. For example, the edge of the semiconductor package SP5 may be located at a higher level-height along the Z direction than the central part of the semiconductor package SP5. In some alternative embodiments, the edge of the semiconductor package SP5 may be located at a lower level height along the Z direction than the central part of the semiconductor package SP5. In some embodiments, the deformation of the edge in the Z direction may happen at a substantially same amount along the X and Y direction (concentric-type warpage). In some alternative embodiments, the deformation in the Z direction of the edge may be stronger along one direction (e.g., the X direction) than the other direction (e.g., the Y direction). In such cases, the warpage is referred to as potato-type. As illustrated in the embodiments of FIG. 2A and FIG. 2B, the upper surfaces SP3u, SP5u and the lower surfaces SP3l, SP5l of the semiconductor packages SP3, SP5 may deform out of plane, becoming significantly curved. In some embodiments, the height difference (difference in height level) ΔH along the Z direction existing between the highest point and the lowest point of the upper surfaces SP3u, SP5u or the lower surfaces SP3l, SP5l may be taken as a measure of the warpage of the semiconductor packages SP3, SP5. In FIG. 2A and FIG. 2B the height difference ΔH is indicated with respect to the lower surfaces SP3l, SP5l for illustrative purposes. In some alternative embodiments, the height difference ΔH may be considered with respect to the upper surfaces SP3u, SP5u, depending on whichever of the two values is greater. In some embodiments, excessive warpage (e.g., a too large height difference ΔH) of the semiconductor packages SP3, SP5 may render impossible performing subsequent steps of the manufacturing process, thus reducing the process yield and increasing the manufacturing costs. As discussed in the following, in some embodiments, warpage of the semiconductor packages SP3, SP5 may be alleviated by controlling the fan-out ratio of the semiconductor packages SP3, SP5.

Figure 3C:
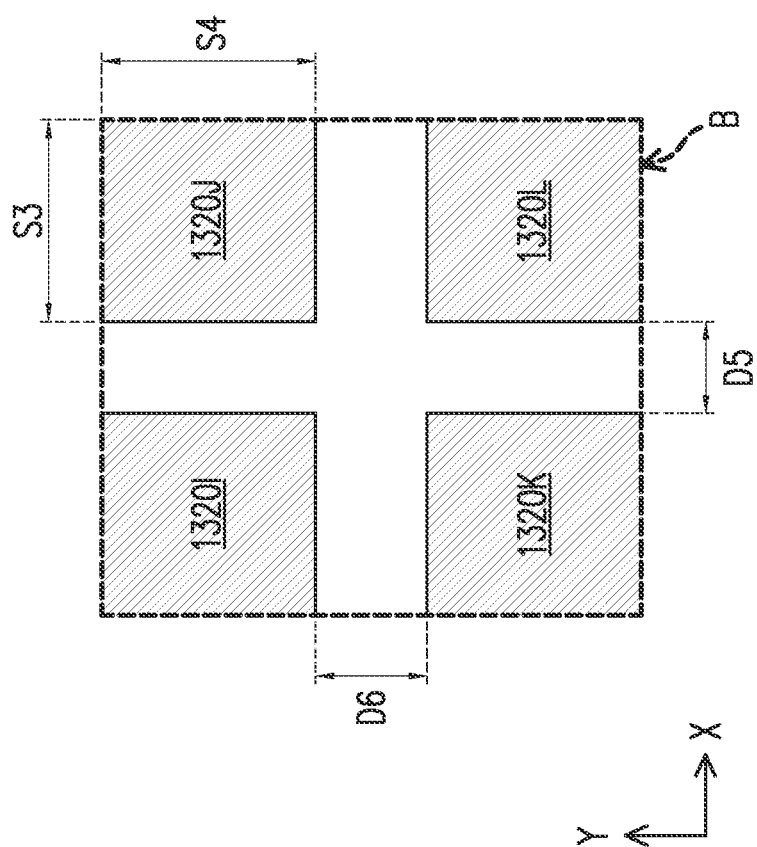

FIG. 3A is a schematic cross-sectional view of a semiconductor package SP10 according to some embodiments of the disclosure. FIG. 3B is an enlarged view of the portion of the semiconductor package SP10 enclosed by the area A illustrated in FIG. 3A. FIG. 3C is an enlarged view of the portion of the semiconductor package SP10 enclosed by the area B illustrated in FIG. 3B. The semiconductor package SP10 may have a similar structure to the semiconductor package SP1 of FIG. 1I, and may be manufactured following a similar process as previously described with reference to FIG. 1A to FIG. 1I. The cross-sectional view of FIG. 3A is taken in a XY plane located at a level height along the thickness direction (i.e., the Z direction illustrated in FIG. 1I) passing through the semiconductor dies 1200, the dummy dies 1310, 1320, and the encapsulant 1400. As illustrated in FIG. 3A, the semiconductor package SP10 includes semiconductor dies 1200 disposed in an array configuration (e.g., a matrix MT of m rows and n columns). In some embodiments, the semiconductor dies 1200 may have a square or rectangular footprint. For example, a ratio of the length S1 of a side surface extending along a first direction (e.g., the X direction) to the length S2 of a side surface extending along a second direction (e.g., the Y direction) may be in the range from 0.1 to 10. In some embodiments, the footprint of a semiconductor die 1200 may be in the range from 4 mm$^2$ to 900 mm$^2$. For example, the footprint of the semiconductor die 1200 may be about 625 mm$^2$. The semiconductor dies 1200 may be disposed towards the central region of the semiconductor package SP10.

The semiconductor package SP10 also includes one or more types of dummy dies, for example the dummy dies 1310 and 1320. The footprints of the dummy dies 1310, 1320 may independently be in the range between 1 mm$^2$ and 900 mm$^2$. For example, at least some of the dummy dies 1310, 1320 may have a footprint of about 6 mm$^2$, 36 mm$^2$, or 100 mm$^2$. In some embodiments, the semiconductor package SP10 includes two types of dummy dies, with the dummy dies 1310 having a larger footprint than the dummy dies 1320. In some embodiments, the footprint of the dummy dies 1310 may be similar (or even substantially equal) to the footprint of the semiconductor dies 1200. As illustrated in FIG. 3A, the dummy dies 1310 may form a square or rectangular ring R1 surrounding the array of semiconductor dies 1200. The dummy dies 1320 may be smaller than the dummy dies 1310 and the semiconductor dies 1200. The footprint of the dummy dies 1320 may be square or rectangular. For example, the ratio of the length S3 of a side surface extending along a first direction (e.g., the X direction) to the length S4 of a side surface extending along a second direction (e.g., the Y direction) may be in the range from 0.1 to 10. In some embodiments, the dummy dies 1320 may be disposed around the ring R1 of dummy dies 1320, and also in between adjacent dummy dies 1310, between adjacent dummy dies 1310 and semiconductor dies 1200, and in between adjacent semiconductor dies 1200. For example, the dummy dies 1320 may be disposed in an area of the semiconductor package SP10 extending from the ring R1 towards the edge E of the semiconductor package SP10. A row of dummy dies 1320 extending along a first direction (e.g., the X direction) may be disposed in between two dummy dies 1310 consecutive along a second direction (e.g., the Y direction) perpendicular to the first direction. Similarly, a row of dummy dies 1320 extending along a first direction (e.g., the X direction) may be disposed in between two semiconductor dies 1200 belonging to a same row or column of the matrix MT and consecutive along a second direction (e.g., the Y direction) perpendicular to the first direction. That is, one or more row of dummy dies 1320 may be disposed in between the rows and columns of the array of semiconductor dies 1200.

In some embodiments, the dummy dies 1320 located in between the semiconductor dies 1200 of the matrix MT may be disposed along intersecting lines. For example, referring to FIG. 3B, the semiconductor dies 1200A and 1200B may belong to a same row of the matrix MT, and the semiconductor dies 1200C and 1200D may belong to an adjacent row of the matrix MT. At the same time, the semiconductor dies 1200A and 1200C may be considered to belong to a same column of the matrix MT and the semiconductor dies 1200B and 1200D may be considered to belong to an adjacent column of the matrix MT. The line L1 of dummy dies 1320 extends along the same direction as the rows of semiconductor dies 1200A-D (e.g., the X direction), and intersects with the line L2 extending along the same direction as the columns of semiconductor dies 1200A-D (e.g., the Y direction). At the intersection between the two lines L1 and L2, each line L1 or L2 may present a gap G1 or G2, respectively. The gaps G1 and G2 may form a through hole space THS in which no die (neither a semiconductor die 1200 nor a dummy die 1310 or 1320) is disposed. That is, the through hole spaces THS may be filled by the encapsulant 1400. In some embodiments, the through hole spaces THS may be drilled trough (for example via laser drilling) to form the through holes TH (illustrated in FIG. 1J) when the semiconductor package SP10 is integrated in larger semiconductor devices (e.g., the semiconductor device SD1 of FIG. 1J). In some embodiments, each gap G1, G2 may independently be in the range from 1000 micrometers to 10000 micrometers. For example, the gaps G1 and G2 may be about 5000 micrometers.

In some embodiments, the die-to-die spaces D1-D6 between adjacent dummy dies 1320 (or between a dummy die 1320 and an adjacent dummy die 1310 or semiconductor die 1310) may be in the range between 20 micrometers and 1000 micrometers. Each of these die-to-die spaces D1-D6 may be varied independently. For example, the die-to-die spaces D1 and D3 between the dummy dies 1320 located among the semiconductor dies 1200 may be about 200 micrometers, the die-to-die spaces D2 and D4 between the dummy dies 1320 and the semiconductor dies 1200 or the dummy dies 1310 may be about 400 micrometers, and the die-to-die spaces D5 and D6 between dummy dies 1320 located between the ring R1 and the edge E may be about 70 micrometers. However, the disclosure is not limited thereto. In some embodiments, the distance between consecutive dummy dies 1320 in a line L1 or L2 may not be constant along the line L1 or L2. For example, proceeding along the line L1, the dummy die 1320A may be separated by the distance D1 from the dummy die 1320B, and the dummy die 1320G may be separated by the same distance D1 from the dummy die 1320H. However, the dummy dies 1320B and 1320G (which immediately follows the dummy die 1320B along the line L1) may correspond to the gap G1.

Figure 4B:
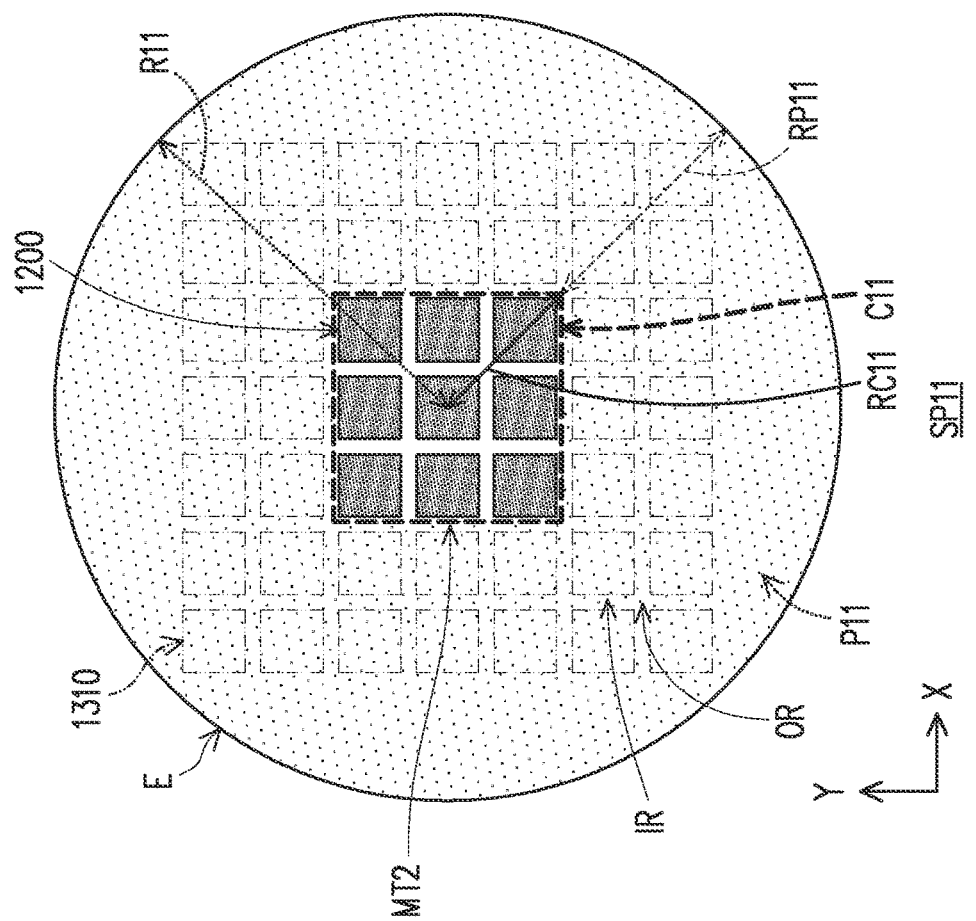
FIG. 4A to FIG. 4F are schematic cross-sectional views of semiconductor packages according to some embodiments of the present disclosure.
Figure 4A:
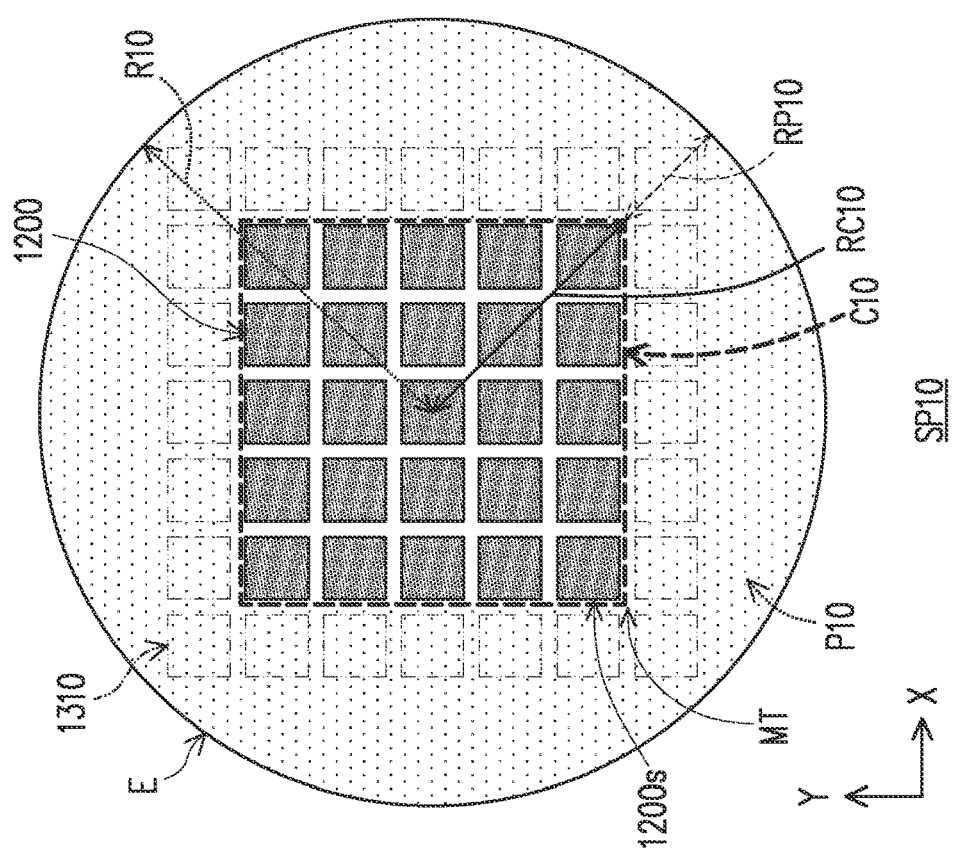

In some embodiments, the disposition, the type, and the number of dummy dies 1310, 1320 may be varied to reduce the warpage of the semiconductor package SP10. FIG. 4A is a schematic cross-sectional view of the semiconductor package SP10 according to some embodiments of the disclosure. For clarity of illustration, in FIG. 4A the dummy dies 1320 are omitted, while the positions of the dummy dies 1310 are illustrated with dash-double-dotted lines. The positions of the semiconductor dies 1200 are illustrated with solid lines. In some embodiments, it may be possible to divide the semiconductor package SP10 in two regions, namely a central region C10 and a peripheral region P10. In FIG. 4A, the border of the central region C10 is illustrated by a dashed line. The peripheral region P10 is considered the area extending from the border of the central region C10 to the edge E of the semiconductor package SP10, and is represented in FIG. 4A as the dotted area. In some embodiments, the central region C10 may coincide with the region of the semiconductor package SP10 spanned by the semiconductor dies 1200. For example, the border of the central region C10 may be defined by the outer surfaces 1200s of the outermost semiconductor dies 1200 facing the edge E of the semiconductor package SP10. More specifically, the outer surfaces 1200s forming the boundary of the central region C10 may be the ones facing the edge E of the semiconductor package SP10 without other semiconductor dies 1200 interposed in between. The outermost semiconductor dies 1200 may be considered the semiconductor dies 1200 closer to the edge E of the semiconductor package SP10 considering the radial directions of the semiconductor package SP10 (i.e., the directions of the radii R10). For example, when the semiconductor dies 1200 are disposed in an array configuration such as the matrix MT, the outermost semiconductor dies 1200 may be the semiconductor dies 1200 disposed forming the sides of the matrix MT (the outer ring of the matrix), and the border between the central region C10 and the peripheral region P10 may coincide with the perimeter of the matrix MT.

In some embodiments, the semiconductor package SP10 may be a wafer-size semiconductor package, and have a circular footprint of radius R10. In some embodiments, the peripheral region P10 may be located at the outer area of the semiconductor package SP10, for example spanning 25 to 40% of the radius R10. That is, the radius (or the radial width) RP10 of the peripheral region P10 measured along the radius R10 of the semiconductor package may correspond to 25 to 40% of the radius R10. The remaining part of the radius R10 may correspond to the radial width RC10 of the central region C10. However, the disclosure is not limited thereto. For example, in some alternative embodiments, the radius RC10 of the central region C10 may be between ⅓ and ⅔ of the radius R10 of the semiconductor package SP10. In some embodiments, the total area of the central region C10 may be between 5% to 50% of the total area of the semiconductor package SP10. For example, as illustrated in FIG. 4B, the semiconductor package SP11 may include fewer semiconductor dies 1200 and more dummy dies 1310 than the semiconductor package SP10. The central region C11 of the semiconductor package SP11 may be smaller (cover a smaller area) than the central region C10 of the semiconductor package SP10. In some embodiments, the semiconductor dies 1200 may be still disposed in an array configuration, for example forming the matrix MT2, and the dummy dies 1310 may form an inner ring JR and an outer ring OR around the matrix MT2. That is, the dummy dies 1310 may be disposed along concentric rings around the matrix MT2. In some alternative embodiments, as illustrated for the semiconductor package SP12 in FIG. 4C, more semiconductor dies 1200 than the ones illustrated in FIG. 4A or FIG. 4B may be included, and the corresponding central region C12 may extend further towards the edge E of the semiconductor package with respect to the central regions C10 or C11. In some embodiments, the matrix MT3 of semiconductor dies 1200 may occupy the same space occupied by the semiconductor dies 1200 and the dummy dies 1310 in the semiconductor packages SP10 or SP11, so that no dummy dies 1310 are included in the semiconductor package SP12. Smaller dummy dies (e.g., the dummy dies 1320 illustrated in FIG. 3A), may however be included both in the central region C12 and in the peripheral region P12. As illustrated in FIG. 4A, in some embodiments the central region C10 may have a different shape than the footprint of the semiconductor package SP10. For example, the central region C10 is rectangular, while the semiconductor package SP10 has a circular footprint. If one of the central region C10 or the semiconductor package SP10 is rectangular (e.g., having an elongated rectangle or a square footprint), the radial width RP10 is measured in correspondence of the diagonal of the rectangular shape. In the embodiment illustrated in FIG. 4A, the radial width RC10 of the central region C10 corresponds to the half of the diagonal of the central region C10.

In some embodiments, the warpage of the semiconductor package SP10 may be at least partially controlled or reduced by tuning the vacancy ratios C10' and P10' (vacancy ratios) of the central region C10 and the peripheral region P10. The vacancy ratio of a region of the semiconductor package SP10 may be defined as the ratio between the total area of the region under consideration and the area occupied by the dies (e.g., the functional semiconductor dies 1200 and the dummy dies 1310, 1320) included within the region under consideration. That is, the vacancy ratio may be considered as the inverse of the fraction of the area of the region under consideration occupied by dies (functional and dummy) included in the region under consideration. Generally, the vacancy ratio O' of a region may be calculated according to the formula (1) below:

$$O' = \frac{A_{tot}}{A_{die}} \qquad (1)$$

In formula (1), $A_{tot}$ is the total area of the region under consideration, and $A_{die}$ is the total area occupied by the dies (functional and dummy) included in the region under consideration, namely:

$$A_{die} = \Sigma_i N_i A_{Di} \qquad (2).$$

In formula (2), N refers to the numbers of die included in the region under consideration, $A_D$ refers to the area covered by an individual die, and the index i runs over the different types of dies included in the region under consideration. Other elements which may be included in the region (e.g., TIVs, not shown) do not appear in the denominator. For example, with respect to the central region C10 in FIG. 4A, the vacancy ratio C10' of the central region C10 may be evaluated according to formula (3).

$$C10' = \frac{A_{C10}}{N_{1200} A_{1200} + N_{1320,C10} A_{1320}}. \qquad (3)$$

In formula (3), $A_{C10}$ corresponds to the total area of the central region C10 (the area enclosed by the dashed line in FIG. 4A), $A_{1200}$ is the area of an individual semiconductor die 1200, $N_{1200}$ is the number of semiconductor dies 1200 in the central region C10, $A_{1320}$ is the area of an individual dummy die 1320 (illustrated, e.g., in FIG. 3B), and $N_{1320,C10}$ is the number of dummy dies 1320 included in the central region C10. The dummy dies 1310 and the dummy dies 1320 disposed outside the central region C10 do not appear in the evaluation of the vacancy ratio C10' of the area C10.

Following a similar logic, it is possible to define the vacancy ratio P10' for the peripheral region P10, according to formula (4) below.

$$P10' = \frac{A_{P10}}{N_{1310} A_{1310} + N_{1320,P10} A_{1320}}. \qquad (4)$$

In formula (4), appear the areas ($A_{1310}$ and $A_{1320}$) and the numbers ($N_{1310}$ and $N_{1320,P10}$) of the dummy dies 1310 and 1320 included in the peripheral region P10, respectively. The total area $A_{P10}$ of the peripheral region P10 corresponds to the area (illustrated as a dotted area) extending from the border of the central region C10 to the edge E of the semiconductor package SP10.

In some embodiments, each of the vacancy ratios C10' and P10' may independently be in the range from 1.01 and 3.00. For example, for the semiconductor package SP10, the vacancy ratio C10' may be about 1.1, and the vacancy ratio P10' may be about 1.02. That is, the vacancy ratios C10' and P10' may differ with respect to each other. However, the disclosure is not limited thereto. In some embodiments, the ratio of the vacancy ratio C10' of the central region C10 to the vacancy ratio P10' of the peripheral region P10 may be in the range from 0.3 to 3.0. In some embodiments, the ratio of the vacancy ratio C10' to the vacancy ratio P10' may be in the range from 0.5 to 2. In some embodiments, when the ratio of the vacancy ratios C10' to P10' is in the above range, warpage of the semiconductor package SP10 may be reduced, thus increasing the manufacturing yield and the reliability of the semiconductor package SP10. In some embodiments, the vacancy ratios C10' and P10' may be fine-tuned by careful disposition of the dummy dies 1310, 1320, without need to rearrange the functional semiconductor dies 1200 nor the routing of the redistribution structure. Therefore, reduction of the warpage of the semiconductor package SP10 may be achieved while avoiding costly modifications to the design of the masks used for the fabrication of the redistribution structure.

Figure 4D:
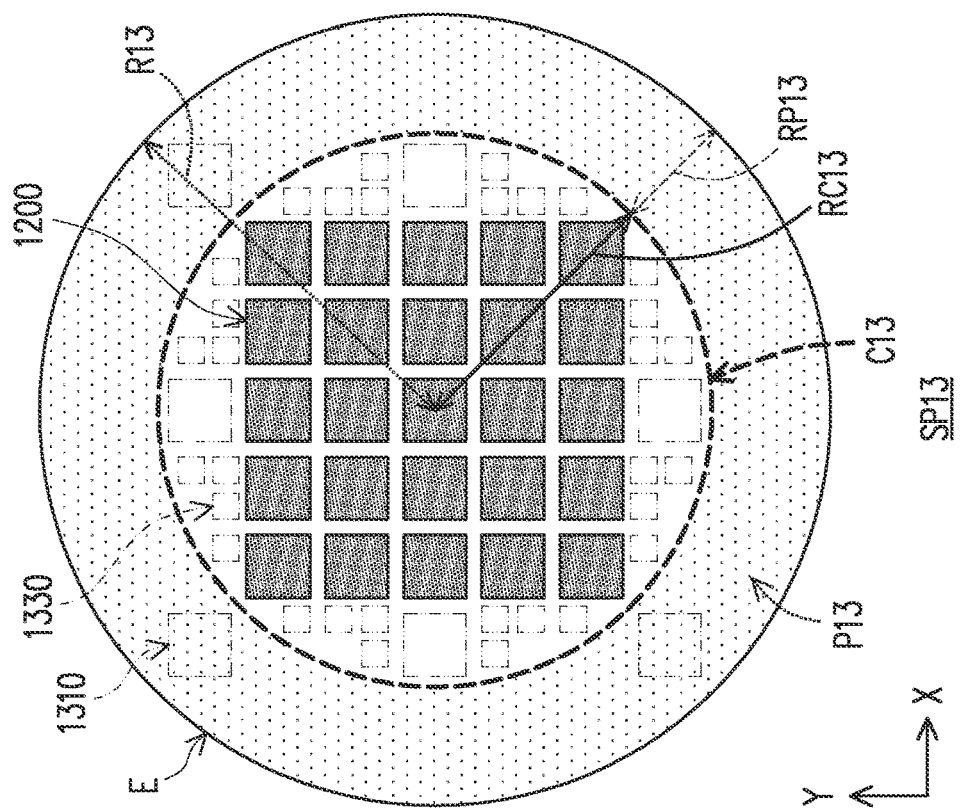
Figure 4C:
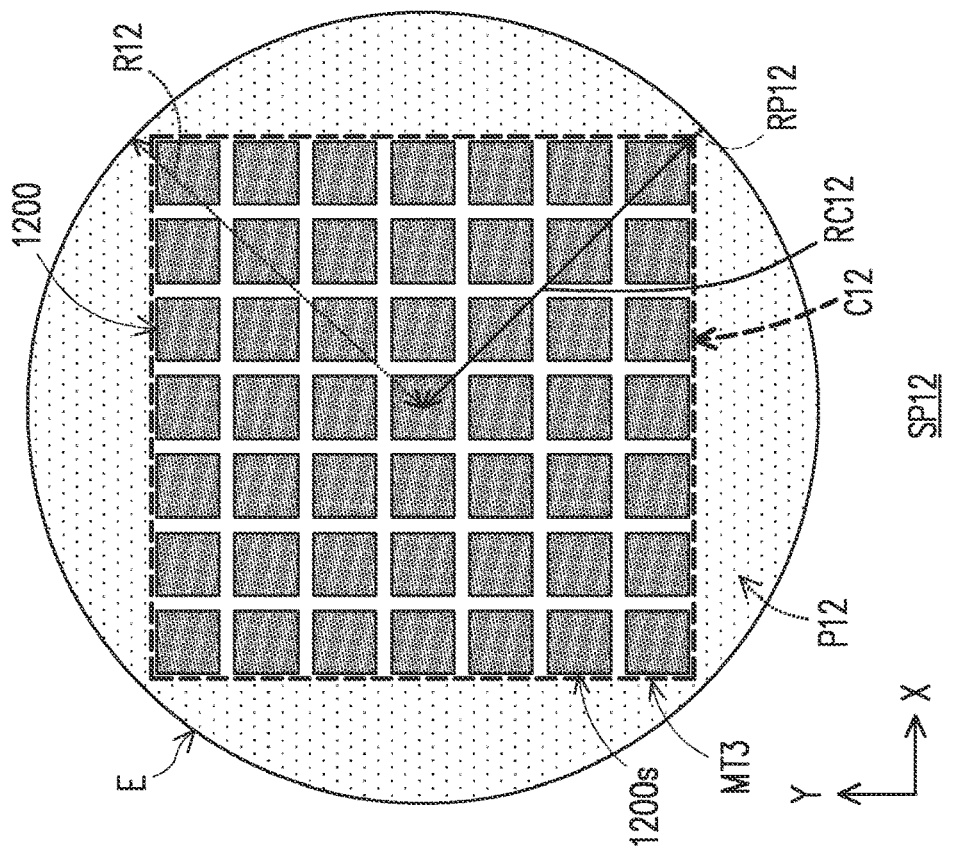

FIG. 4D is a schematic cross-sectional view of a semiconductor package SP13 according to some embodiments of the disclosure. The cross-sectional view of FIG. 4D is taken in a corresponding plane as the cross-sectional view of FIG. 4A. Also, in FIG. 4D are illustrated the footprints of the semiconductor dies 1200 and the dummy dies 1310, while the footprints of the dummy dies 1320 are omitted for clarity of illustration. In some embodiments, the disposition of the semiconductor dies 1200 and the dummy dies 1320 in the semiconductor package SP13 may be the same as the one illustrated in FIG. 3A for the semiconductor package SP10. In some embodiments, the semiconductor package SP13 may have a similar structure to the semiconductor package SP10 of FIG. 3A and FIG. 4A, and may be manufactured following a similar process as previously described with reference to FIG. 1A to FIG. 1I. In some embodiments, a difference between the semiconductor package SP13 and the semiconductor package SP10 lies in the extension of the central region C13. That is, the semiconductor package SP13 may have a larger central region C13. For example, the central region C13 may be a circle of radius RC12 (illustrated as a dashed line), and the peripheral region P13 may be the annular region of radial width RP13 between the boundary of the central region C13 and the edge E of the semiconductor package SP13. The relationship between the radial width RP13 of the peripheral region P13, the radius RC13 of the central region C13, and the radius R13 of the semiconductor package SP13 may be the same as described above with respect to the semiconductor package SP10. In some embodiments, some of the dummy dies 1310 may be disposed within the central region C13, to achieve a desired vacancy ratio C13'. Furthermore, dummy dies 1330 may be disposed in place of some of the dummy dies 1310 with respect to the disposition of the dies in the semiconductor package SP13. The dummy dies 1330 may have a footprint intermediate between the dummy dies 1310 and the dummy dies 1320. That is, the dummy dies 1330 may be larger than the dummy dies 1320 and smaller than the dummy dies 1310. In some embodiments, the dummy dies 1330 may be used to further tune the vacancy ratio C13' of the central region C13 and/or the vacancy ratio P13' of the peripheral region P13. For example, the dummy dies 1330 may be disposed in spaces between the boundary of the central region C13 and the semiconductor dies 1200 too narrow to accommodate a larger dummy die 1310.

In some embodiments, the disposition of the functional semiconductor dies 1200 may be determined as a function of the desired interconnection in the finished semiconductor package SP13, for example taking into account number, shape, and function of the individual semiconductor dies 1200, and the required routing in the overlying redistribution structure. Once the position of the semiconductor dies 1200 and the routing of the redistribution structure is optimized, the shape and the extension of the central region C13 (and, hence, of the peripheral region P13) may be established. Thereafter, the vacancy ratios C13' and P13' of the two regions C13 and P13 may be tuned by disposing the dummy dies in empty spaces within the regions C13 and P13. For example, as illustrated in FIG. 4D, the central region C13 may extend further towards the edge E of the semiconductor package SP13 with respect to the outermost semiconductor dies 1200, and some additional dummy dies (e.g., 1310, 1330) may be disposed in the space between the outermost semiconductor dies 1200 and the boundary of the central region C13 to achieve the desired vacancy ratio C13'. In some embodiments, the disposition of the dummy dies may be optimized through simulations of the manufacturing process, to determine which disposition of the dummy dies minimizes the warpage of the manufacturing intermediate(s) and/or the final product.

Figure 4F:
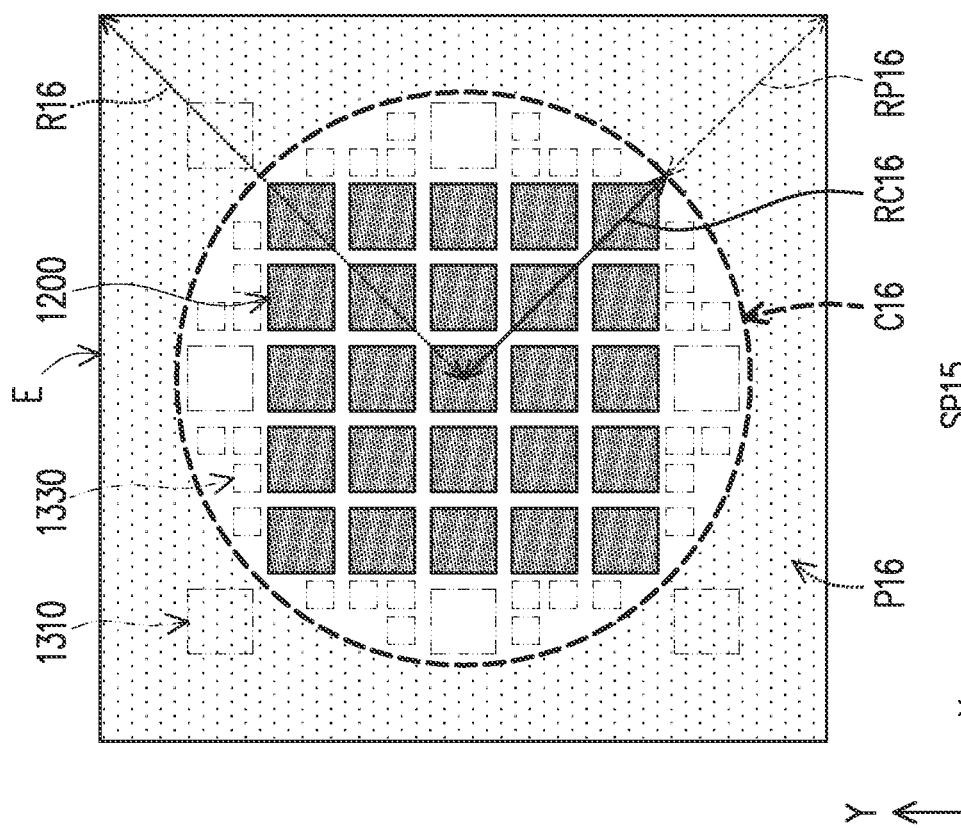
Figure 4E:
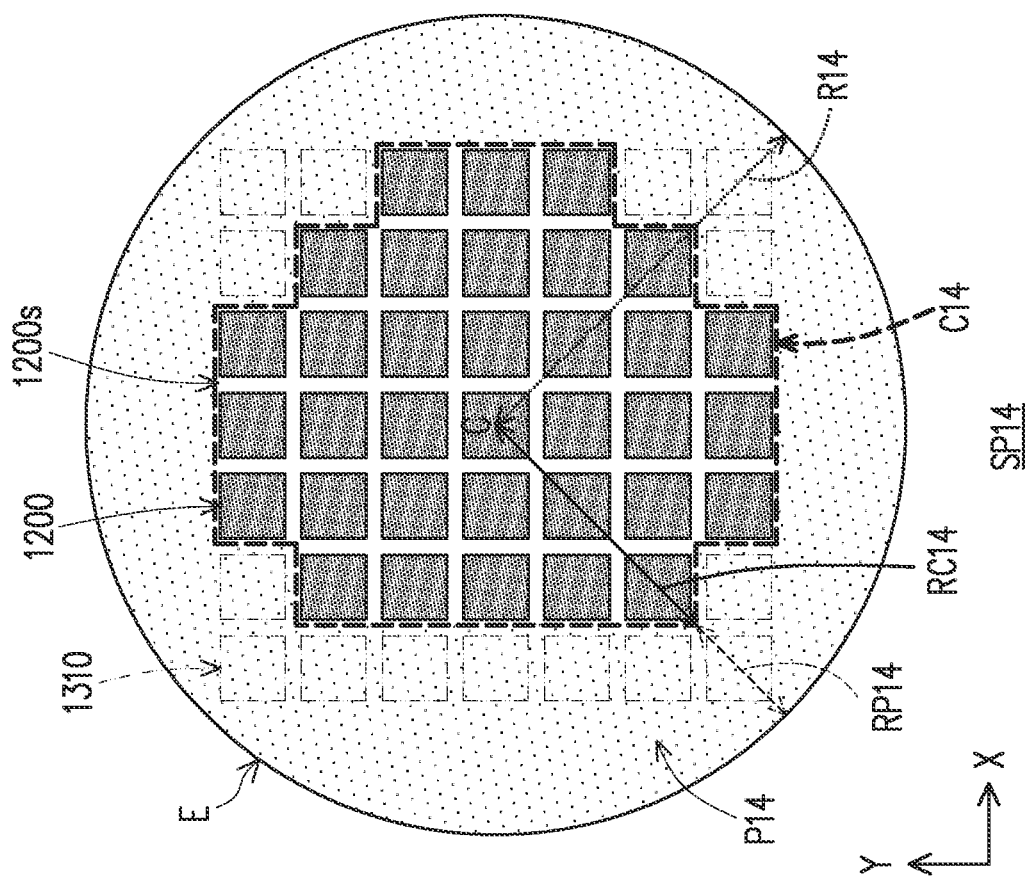

FIG. 4E is a schematic cross-sectional view of a semiconductor package SP14 according to some embodiments of the disclosure. The cross-sectional view of FIG. 4E is taken in a corresponding plane as the cross-sectional view of FIG. 4A. Also, in FIG. 4E are illustrated the footprints of the semiconductor dies 1200 and the dummy dies 1310, while the footprints of the dummy dies 1320 are omitted for clarity of illustration. In some embodiments, the semiconductor package SP14 may have a similar structure to the semiconductor package SP10 of FIG. 3A and FIG. 4A and SP13 of FIG. 4D, and may be manufactured following a similar process as previously described with reference to FIG. 1A to FIG. 1I. In some embodiments, a difference between the semiconductor package SP14 and the semiconductor packages SP10 and SP13 lies in the number of functional semiconductor dies 1200 included. For example, the semiconductor package SP14 may include a number of semiconductor dies 1200 not sufficient to fill a square or rectangular array, or the desired routing is such that not all the semiconductor dies 1200 may be positioned in a square or rectangular array. For example, as illustrated in FIG. 4E, the majority of the semiconductor dies 1200 may be disposed in a square array in the central region C14, while other semiconductor dies 1200 may be disposed along the sides (e.g., three sides) of the square. Furthermore, the semiconductor dies 1200 disposed along the sides of the square may extend for only a portion of the side. For example, the square may be a 5×5 array, but only three semiconductor dies 1200 may be disposed outside the array along the sides of the array. As illustrated in FIG. 4E, the central region C14 is not limited to have regular shapes as the central regions C13 and C10 of the semiconductor packages SP13 and SP10, respectively, but can also have irregular shapes. When the central region C14 has an irregular shape, the radial width RP14 of the peripheral region P14 is evaluated at the point of maximum radial extension of the central region C14. That is, the radial width RP14 of the peripheral region RP14 is evaluated at the point of minimum distance between the boundary of the central region C14 and the edge E of the semiconductor package SP14. In some embodiments, the radial width RP14 may be within 25 to 40% of the corresponding radius R14. In some alternative embodiments, the radial width RC14 of the central region may be between ⅓ to ⅔ of the radius R14 of the semiconductor package SP14. In some embodiments, the central region C14 of the semiconductor package SP14 is defined by the outer surfaces 1200s of the outermost semiconductor dies 1200. Particularly, the outer surfaces 1200s considered are the ones facing the edge E of the semiconductor package SP14 without other semiconductor dies 1200 interposed in between. The outermost semiconductor dies 1200 are considered the ones radially closer to the edge E of the semiconductor package P14, for example, the semiconductor dies 1200 closer to the edge E along the directions of the radii R14.

FIG. 4F is a schematic cross-sectional view of a semiconductor package SP16 according to some embodiments of the disclosure. The cross-sectional view of FIG. 4F is taken in a corresponding plane as the cross-sectional view of FIG. 4A. Also, in FIG. 4F are illustrated the footprints of the semiconductor dies 1200 and the dummy dies 1310, while the footprints of the dummy dies 1320 are omitted for clarity of illustration. However, in some embodiments, the disposition of the semiconductor dies 1200 and the dummy dies 1310, 1320, 1330 in the semiconductor package SP16 may be the same as the one illustrated in FIG. 4D for the semiconductor package SP13. In some embodiments, the semiconductor package SP16 may have a similar structure to the semiconductor package SP13 of FIG. 4D, and may be manufactured following a similar process as previously described with reference to FIG. 1A to FIG. 1I. In some embodiments, a difference between the semiconductor package SP16 and the semiconductor package SP13 lies in the semiconductor package SP16 being a panel-size semiconductor package, rather than a wafer-size semiconductor package. That is, the semiconductor package SP16 may have a rectangular footprint. In the semiconductor package SP16, the radial width RP16 of the peripheral region P16 is measured in correspondence of the diagonal R16 of the rectangular footprint. In some embodiments, the radial width RP16 is 25 to 40% the length of the diagonal R16. The remaining portion may correspond to the radius (radial width) RC16 of the central region C16, which, in some embodiments, has a circular shape. In some alternative embodiments, the radial width RC16 of the central region C16 may be between ⅓ to ⅔ of the diagonal R16.

Figure 5B:
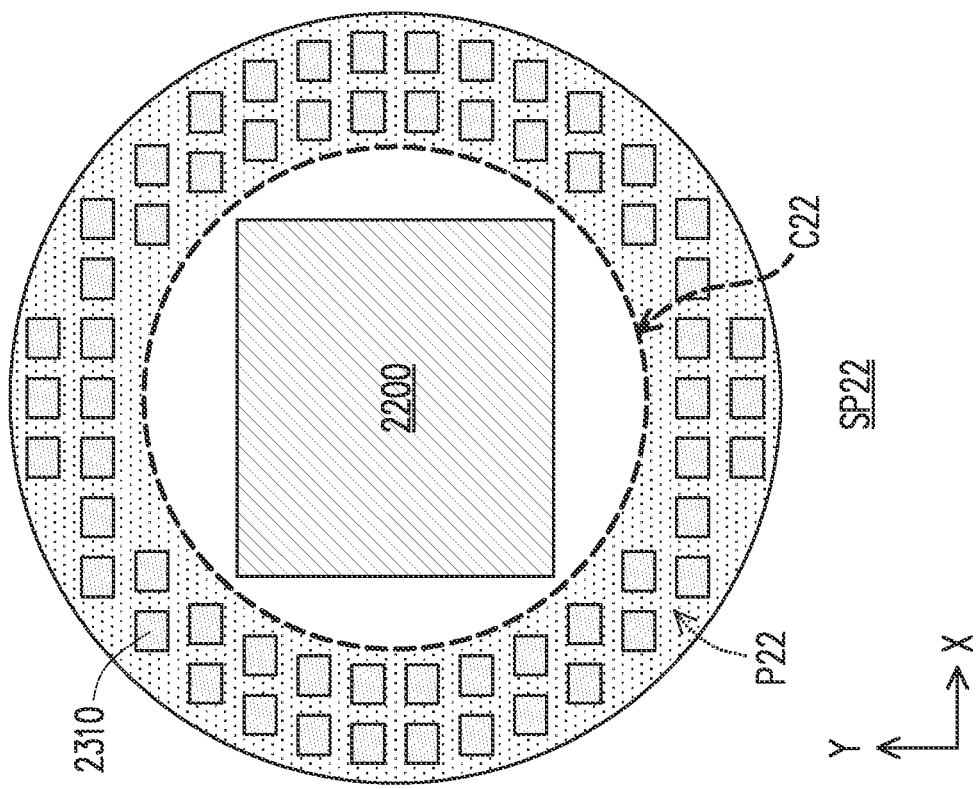
FIG. 5A to FIG. 5D are schematic cross-sectional views of semiconductor packages according to some embodiments of the present disclosure.
Figure 5A:
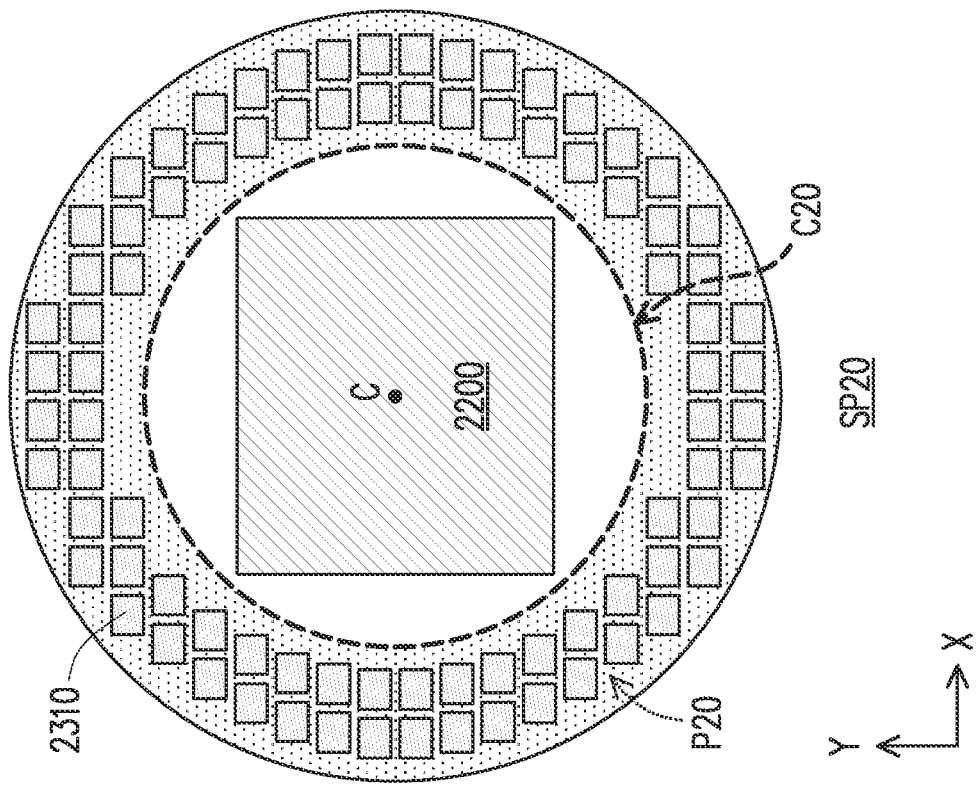

FIG. 5A is a schematic cross-sectional view of a semiconductor package SP20 according to some embodiments of the disclosure. The cross-sectional view of FIG. 5A is taken in a corresponding XY plane as the cross-sectional view of FIG. 4A. The semiconductor package SP20 may have a similar structure as the semiconductor package SP10 of FIG. 4A, and be manufactured following a similar process as described above with respect to FIG. 1A to FIG. 1I. In some embodiments, the semiconductor package SP20 includes a single functional semiconductor die 2200 in the circular central region C20. For example, the semiconductor die 2200 may be a System-on-Chip type of die, integrating multiple functionalities in different areas of the die. In some embodiments, the semiconductor die 2200 may be the only die included in the central region C20. Therefore, the vacancy ratio C20' of the central region C20 may be determined by the area $A_{2200}$ of the semiconductor die 2200 and the area $A_{C20}$ covered by the conductive traces of the redistribution structure (illustrated, e.g., in FIG. 4A). In some embodiments, the semiconductor package SP20 further includes the dummy dies 2310 in the peripheral region P20. In some embodiments, the dummy dies 2310 may be disposed in one or more rings surrounding the central region C20. In some embodiments, the dummy dies 2310 are all disposed in the peripheral region P20. That is, there may be no dummy dies 2310 in the central region C20. However, the disclosure is not limited thereto. In some alternative embodiments, the dummy dies 2310 may also be included in the central region C20.

In some embodiments, when a single functional die such as the semiconductor die 2200 is included as in the semiconductor package SP20, the central region C20 extends further than the span of the semiconductor die 2200. In some embodiments, the central region C20 may be circular (substantially round or elliptical, for example), or rectangular, and be centered on a central point C of the semiconductor package SP20. For example, for a wafer-size semiconductor package as the semiconductor package SP20, the central region C20 may be circular, and a center of the central region C20 may coincide with the central point C of the semiconductor package SP20. In some alternative embodiments, the central region may be rectangular (square or elongated), and the diagonals of the central region may intersect at the central point C. In some yet alternative embodiments, the axes of an elliptical central region may intersect at the central point C. In some embodiments, the central region C20 may extend in between 5% to 50% of the total area of the semiconductor package SP20. For example, the area of the central region C20 may be 5%, 10%, 15%, 20%, 25%, 30%, 35%, 40%, 45%, or 50% of the total area of the semiconductor package SP20. In some embodiments, the area of the central region C20 may be about 20% to 40% larger than the area of the single functional die 2200. For example, the area of the central region C20 may be 20%, 25%, 30%, 35%, or 40% larger than the area of the single functional die 2200.

In some embodiments, it may be desirable to fine-tune the vacancy ratio P20' of the peripheral region P20, for example to reduce the warpage of the semiconductor package SP20. In some embodiments, it may be desirable for cost management or production requirements to change the ratio of the vacancy ratios C20' to P20' without changing the vacancy ratio C20'. In some embodiments, the vacancy ratio P20' of the peripheral region P20 may be fine-tuned by changing the number of dummy dies 2310 included. For example, as illustrated for the semiconductor package SP22 of FIG. 5B, a vacancy ratio P22' higher than the vacancy ratio P20' may be achieved by reducing the number of dummy dies 2310 included in the peripheral region P22. In some alternative embodiments, as illustrated for the semiconductor package SP24 in FIG. 5C, a vacancy ratio P24' equal to the vacancy ratio P22' may be achieved by including a smaller number of larger dummy dies 2320 in the peripheral region P24. For example, in the semiconductor package SP24 dummy dies 2320 of larger footprint may be used in place of the dummy dies 2310 included in the semiconductor packages SP20 and SP22. In some yet alternative embodiments, as illustrated for the semiconductor package SP26 in FIG. 5D, a combination of the smaller dummy dies 2310 and the larger dummy dies 2320 may be included in the peripheral region P26 to fine-tune the vacancy ratio P26'. For example, an outer ring OR of smaller dummy dies 2310 may be disposed closer to the edge E of the semiconductor package SP26 and an inner ring IR of larger dummy dies 2320 may be disposed between the outer ring OR and the border of the central region C20. In some embodiments, the central regions C20, C22, C24, C26 of the semiconductor packages SP20, SP22, SP24, SP26 may have the same vacancy ratios C20', C22', C24, C26'. In some embodiments, the central regions C20, C22, C24, C26 are identical with respect to each other. Furthermore, the vacancy ratios P22', P24', P26' may be equal with respect to each other and smaller than the vacancy ratio P20'. That is, in the semiconductor packages SP22, SP24, SP26 the same vacancy ratio P22', P24, or P26' may be achieved by varying the number and size of the dummy dies 2310, 2320 without changing the layout of the central regions C20, C22, C24, C26.

Figure 5D:
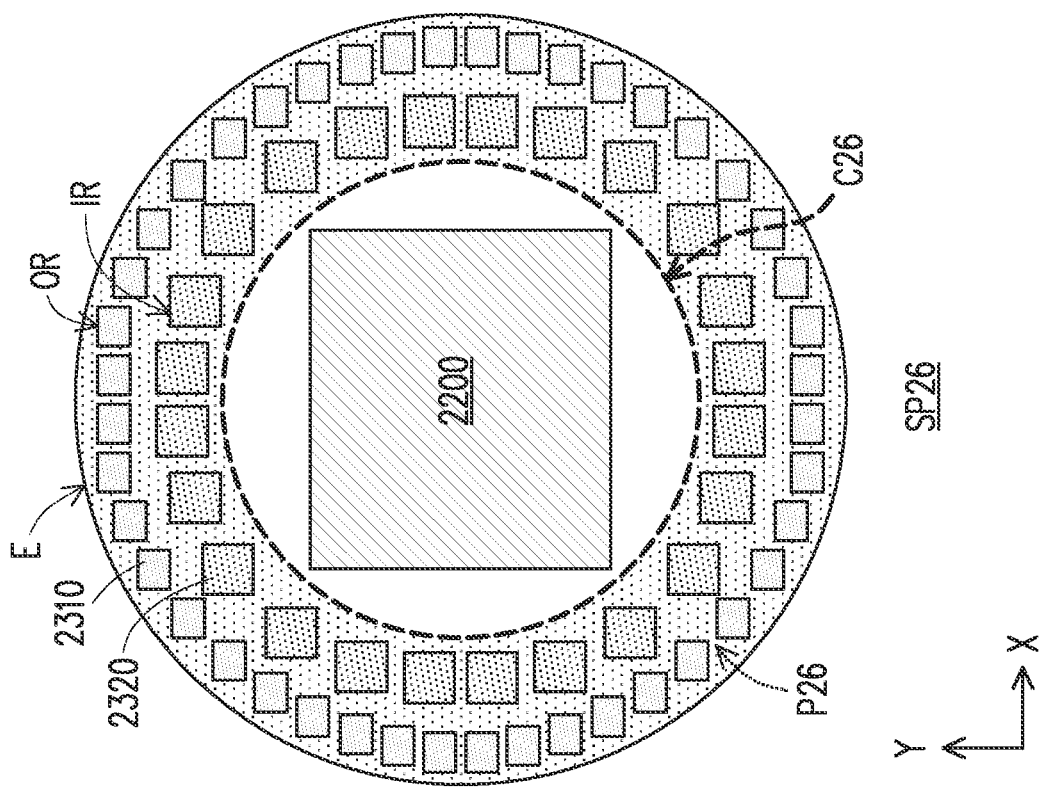
Figure 5C:
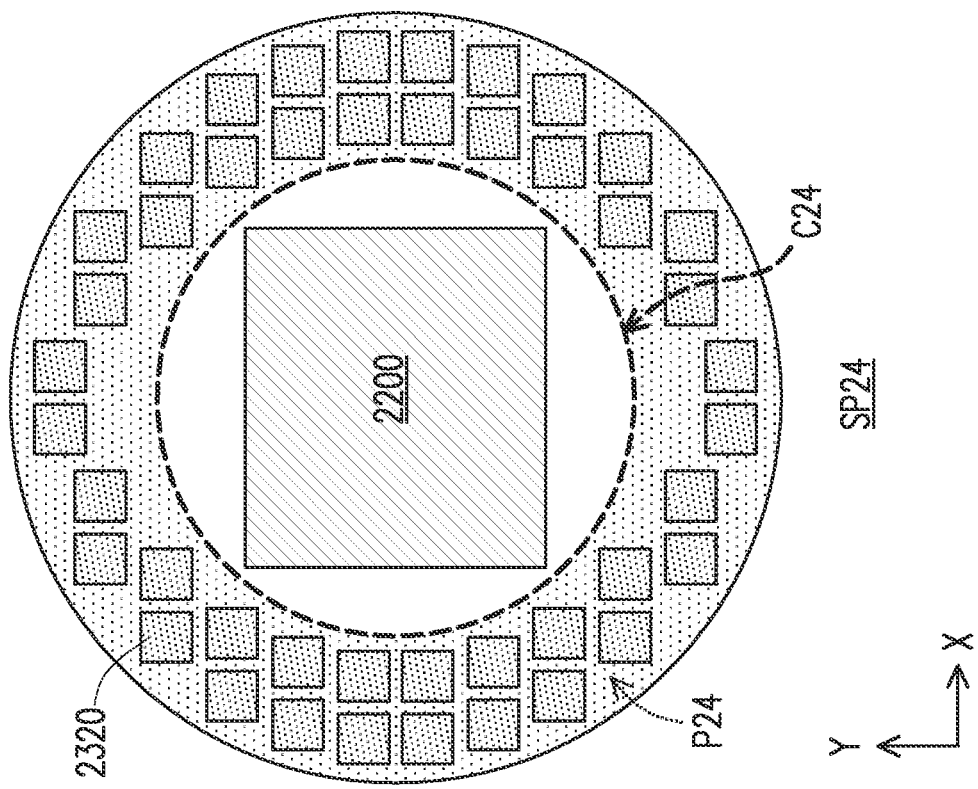
Figure 6B:
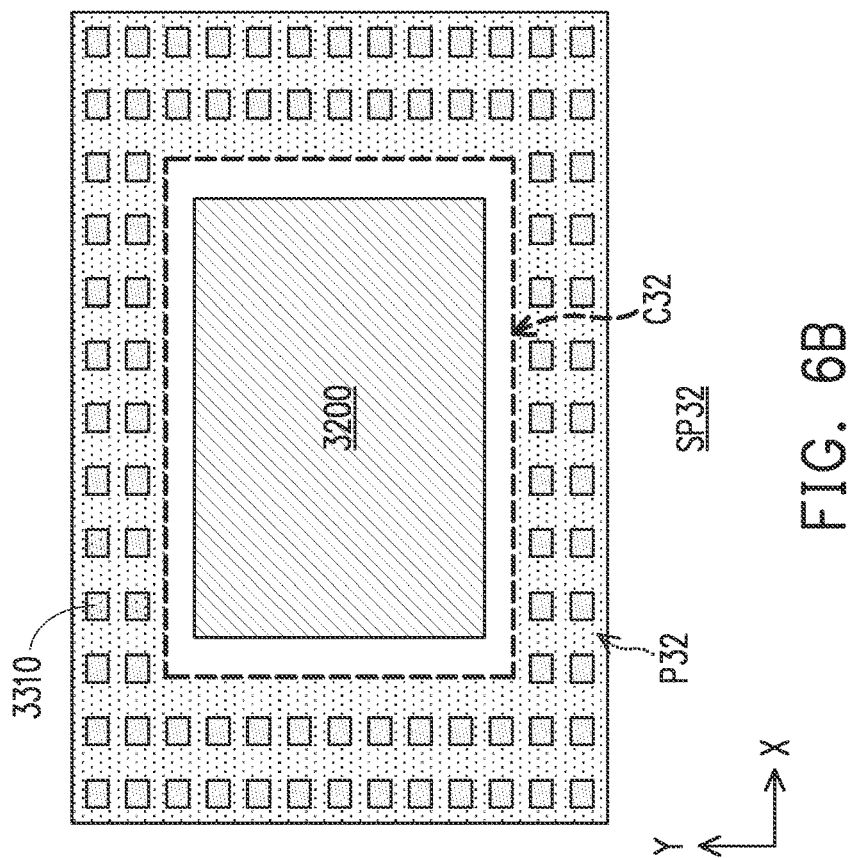
FIG. 6A to FIG. 6D are schematic cross-sectional views of semiconductor packages according to some embodiments of the present disclosure.
Figure 6A:
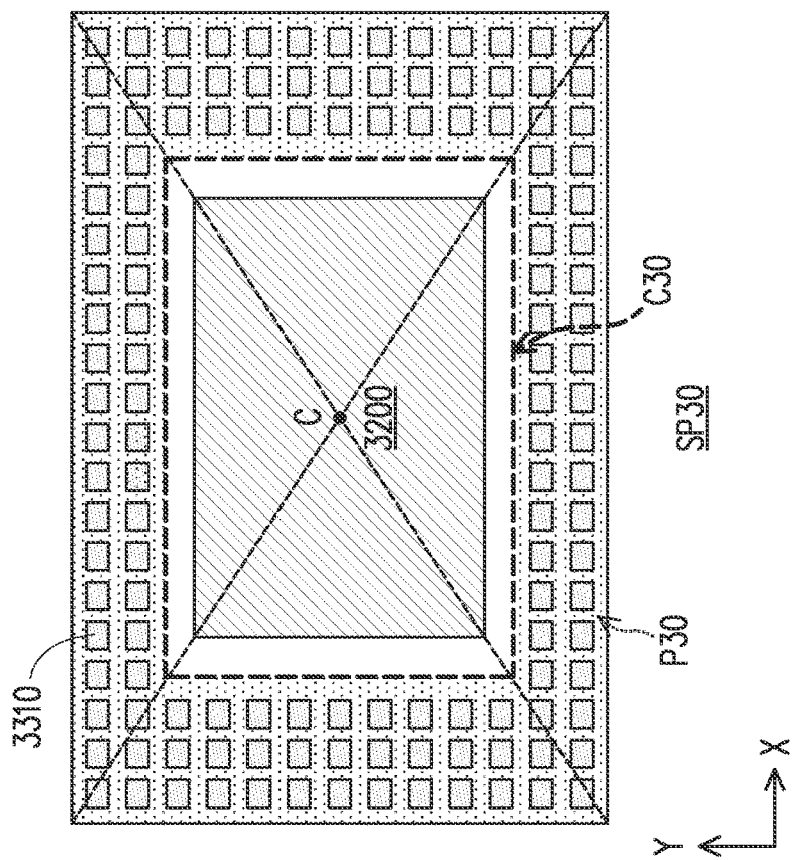
Figure 6D:
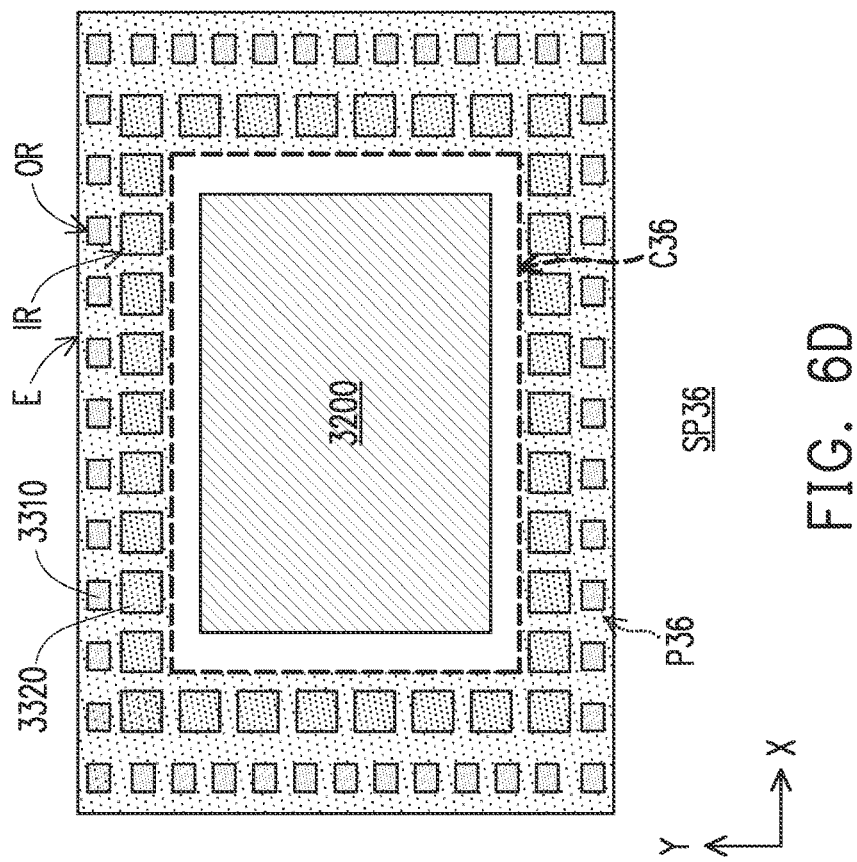
Figure 6C:
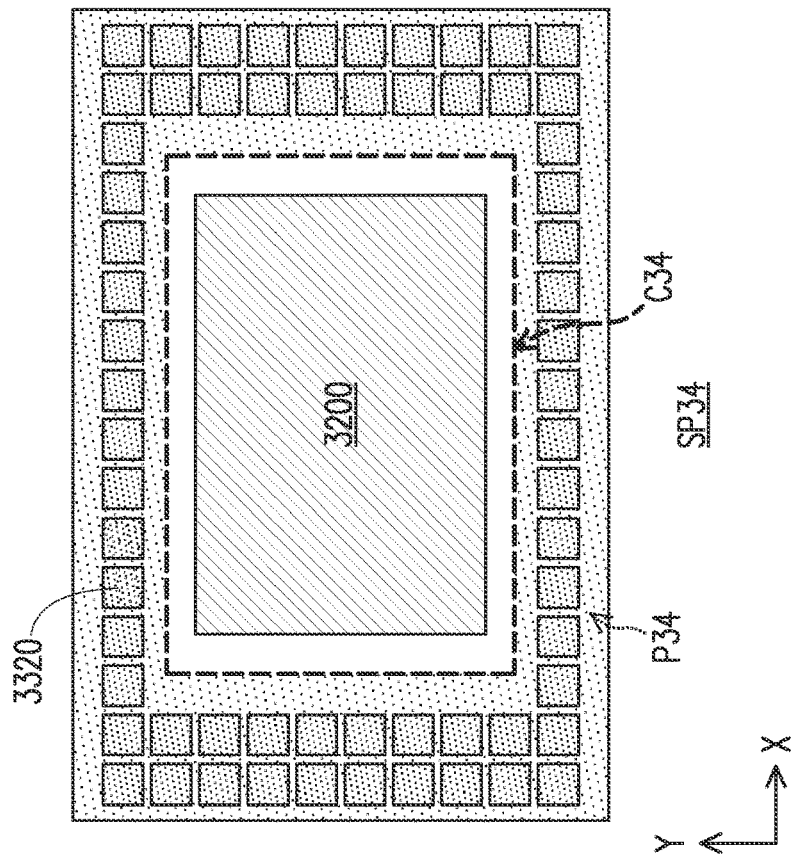
Figure 7B:
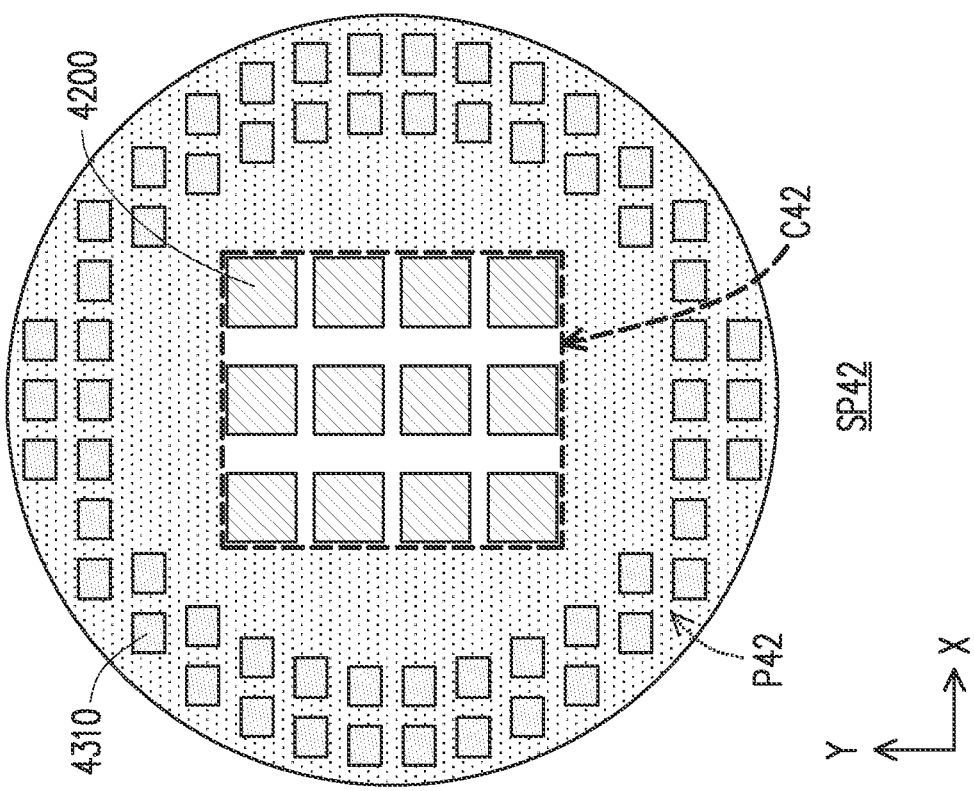
FIG. 7A to FIG. 7D are schematic cross-sectional views of semiconductor packages according to some embodiments of the present disclosure.
Figure 7A:
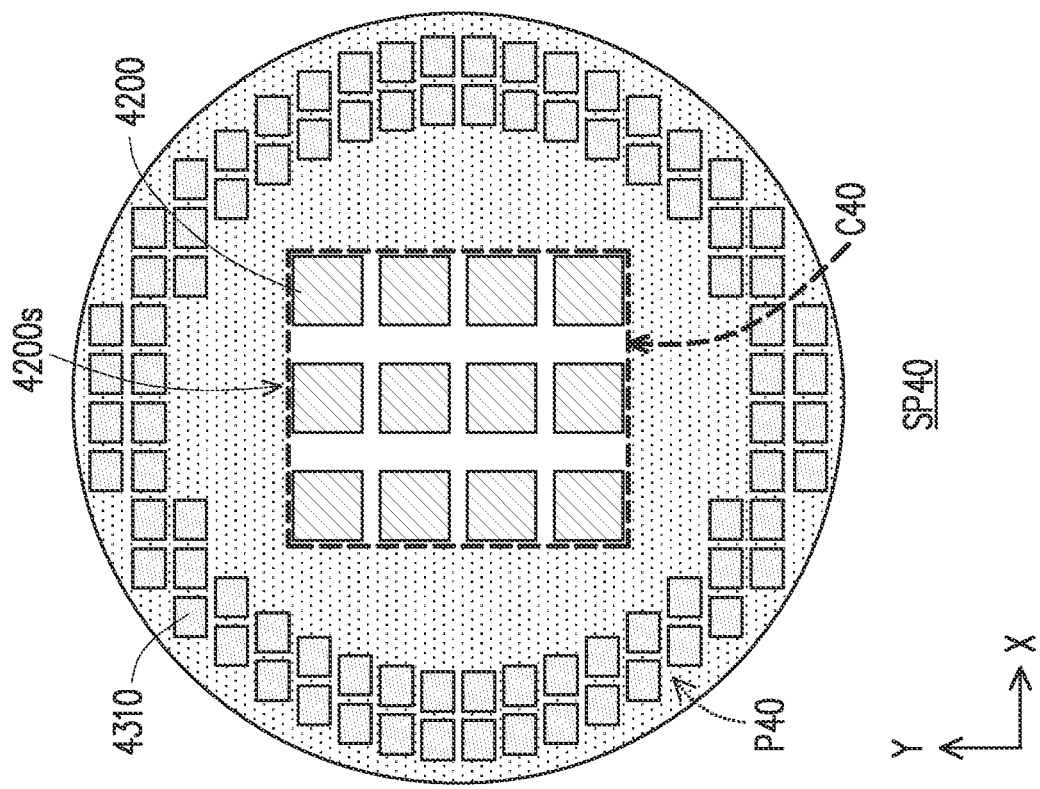
Figure 7D:
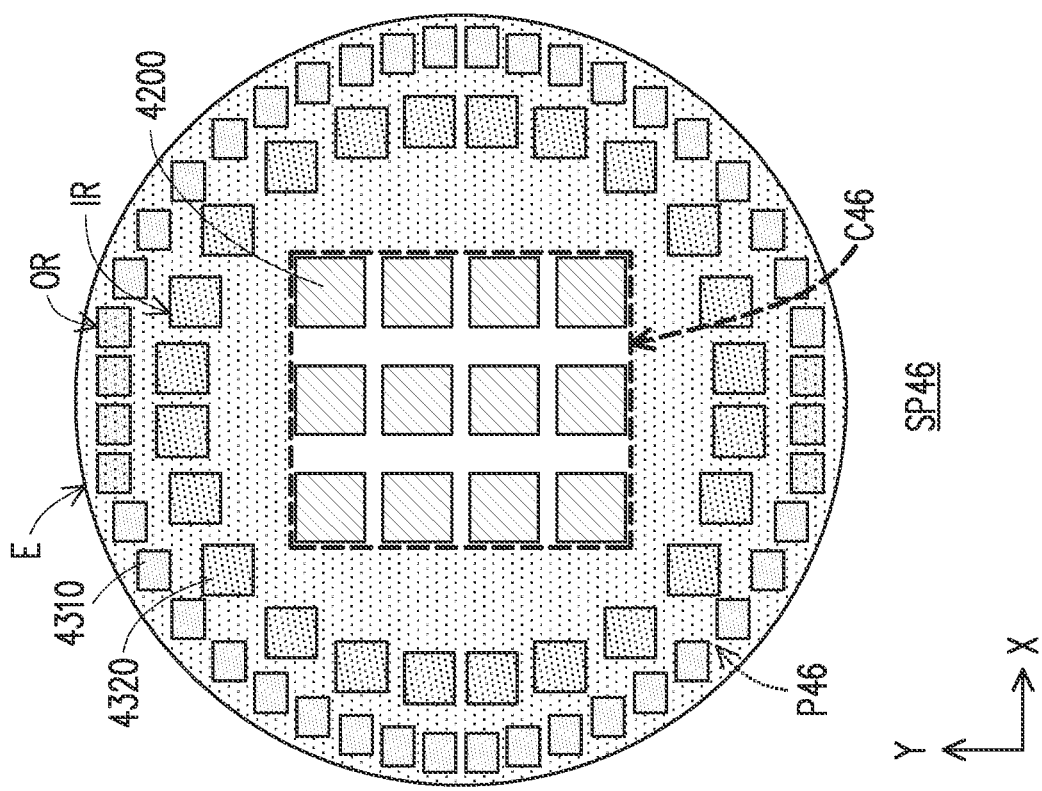
Figure 7C:
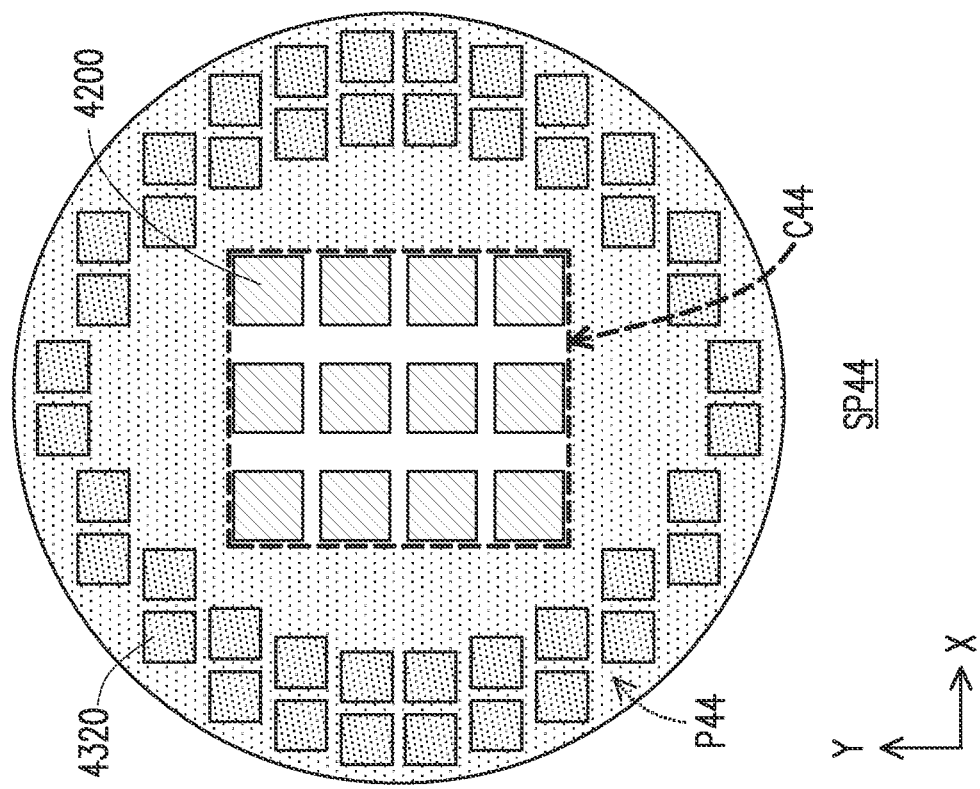
Figure 8B:
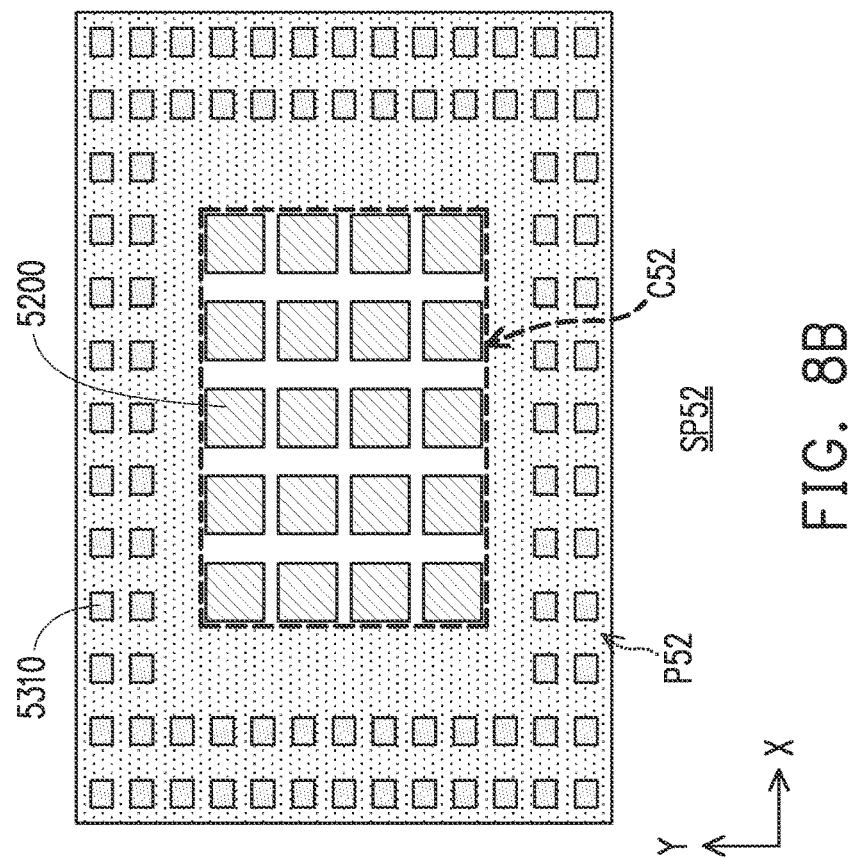
FIG. 8A to FIG. 8D are schematic cross-sectional views of semiconductor packages according to some embodiments of the present disclosure.
Figure 8A:
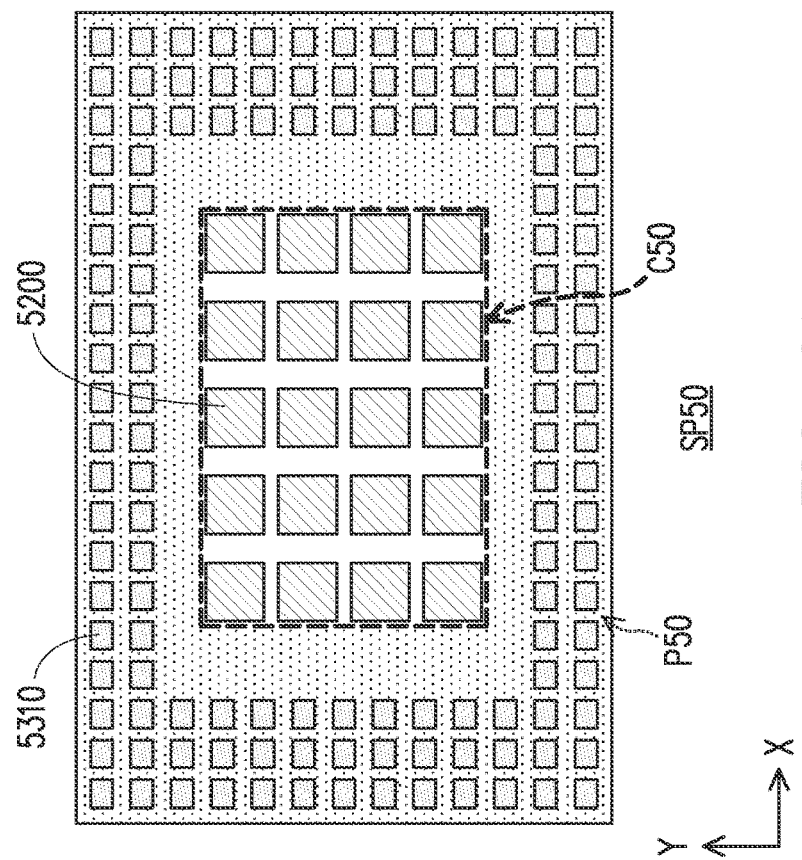
Figure 8D:
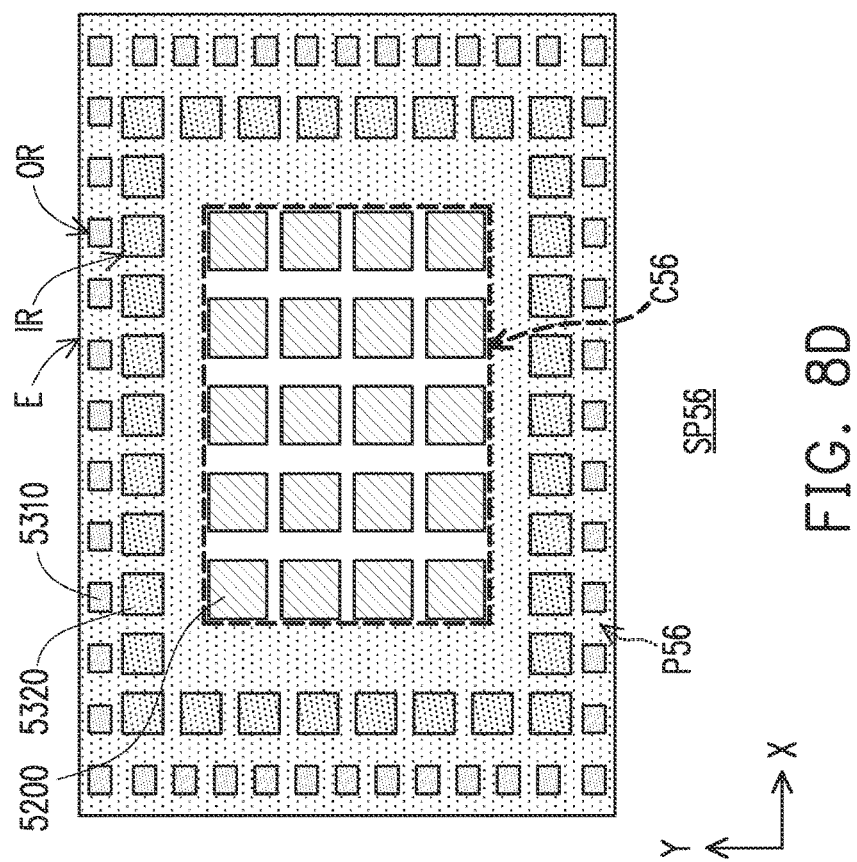
Figure 8C:
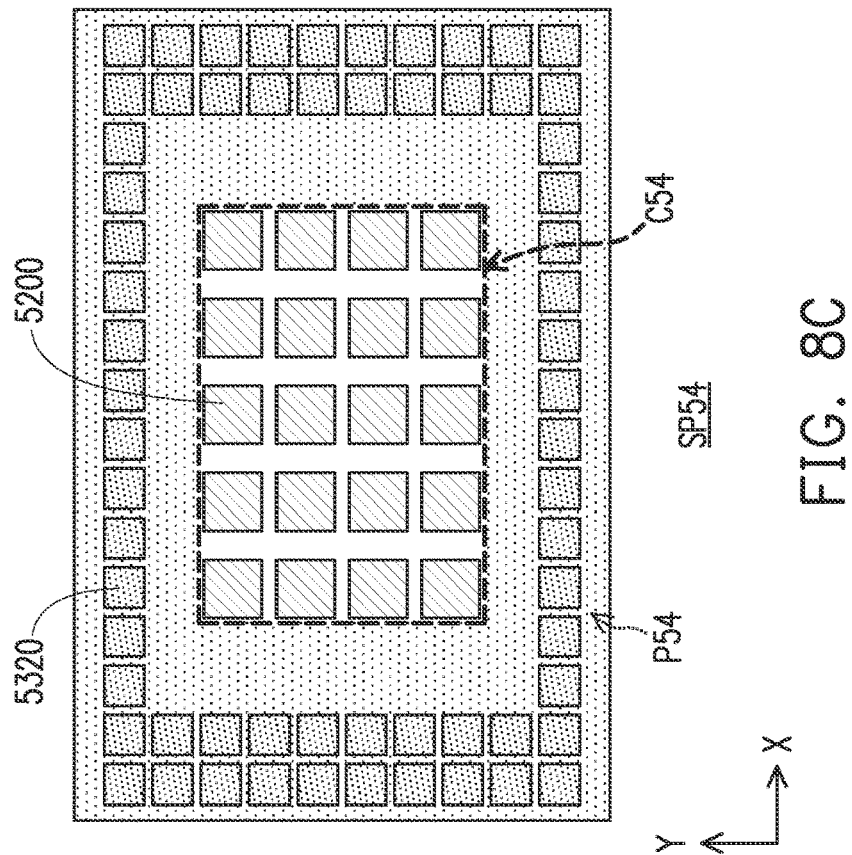
Figure 9B:
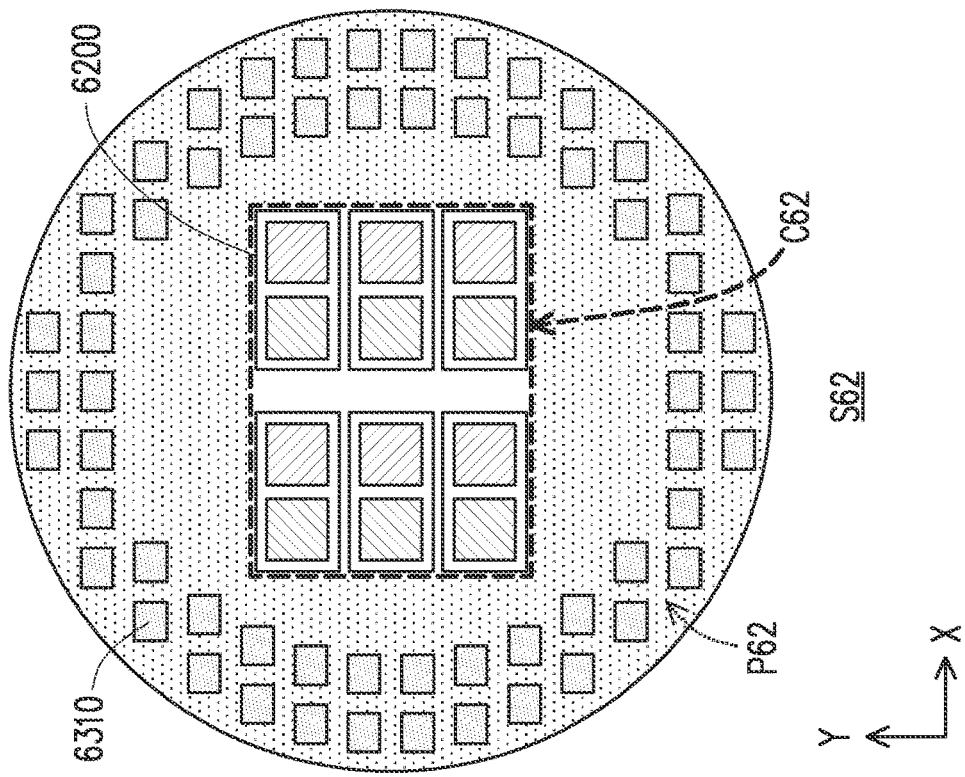
FIG. 9A to FIG. 9D are schematic cross-sectional views of semiconductor packages according to some embodiments of the present disclosure.
Figure 9A:
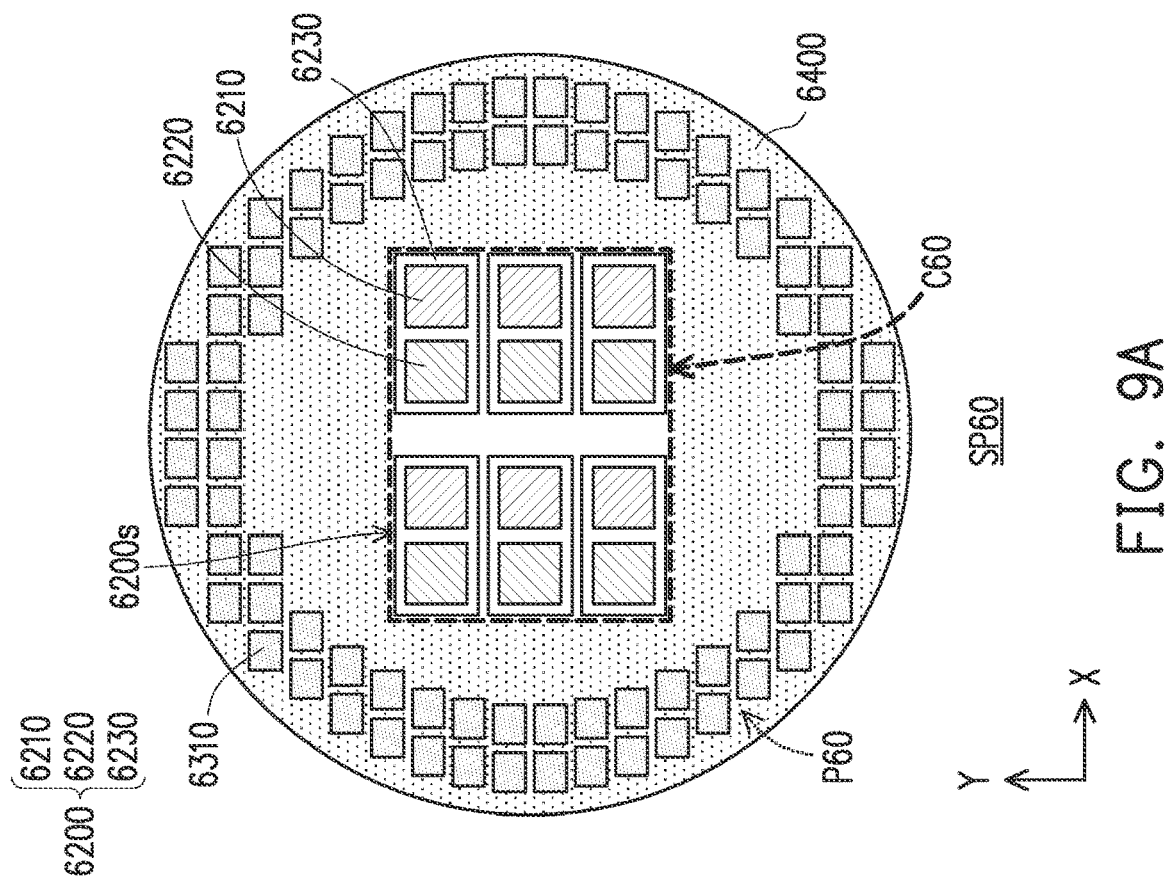
Figure 9D:
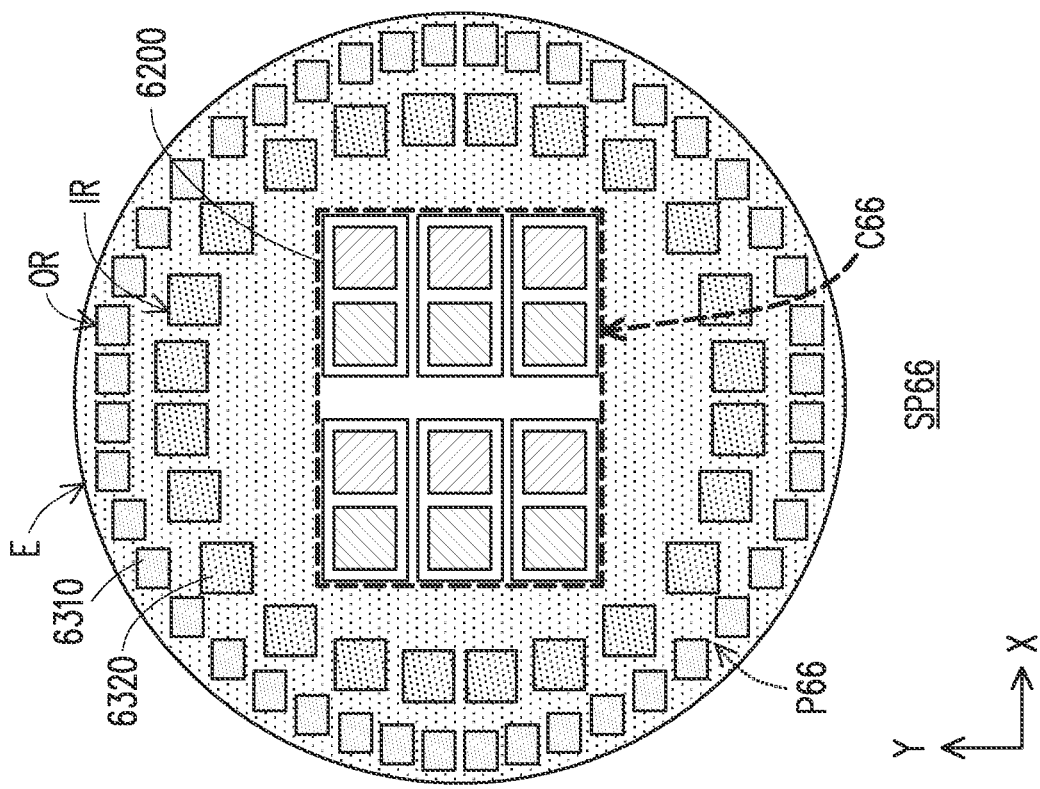
Figure 9C:
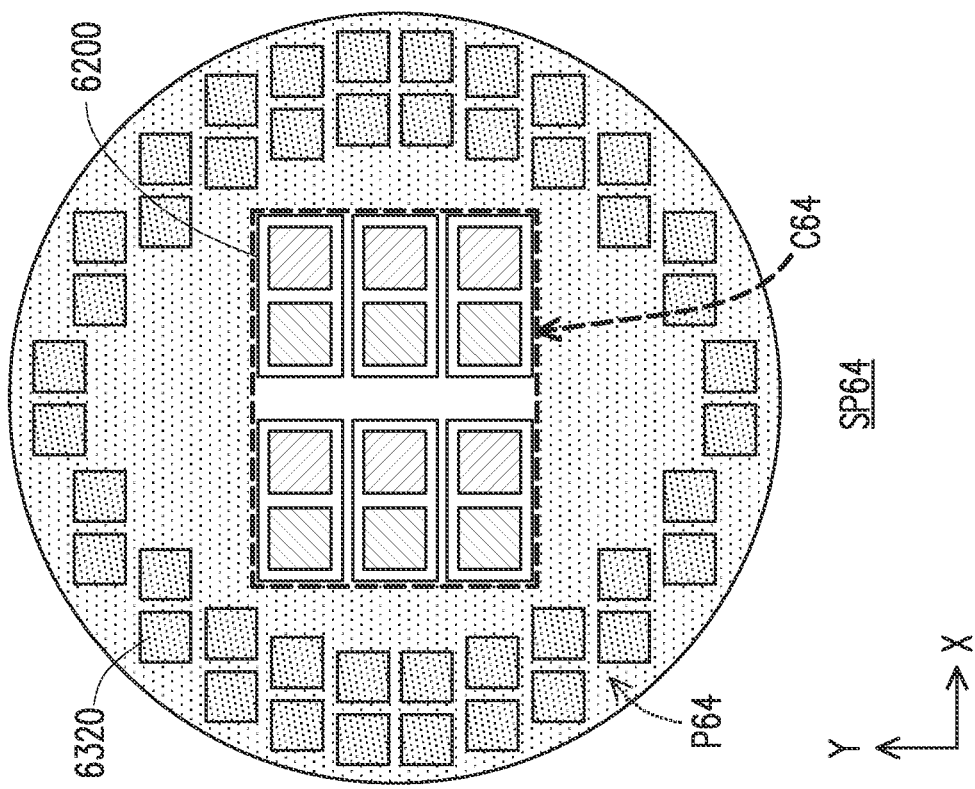
Figure 10A:
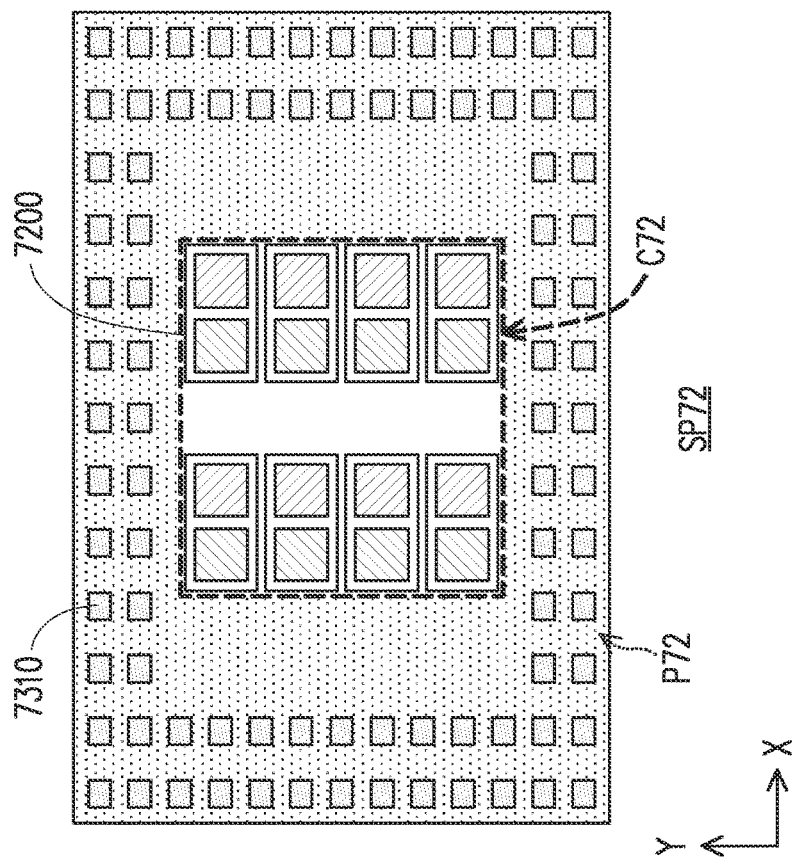
FIG. 10A to FIG. 10D are schematic cross-sectional views of semiconductor packages according to some embodiments of the present disclosure.
Figure 10B:
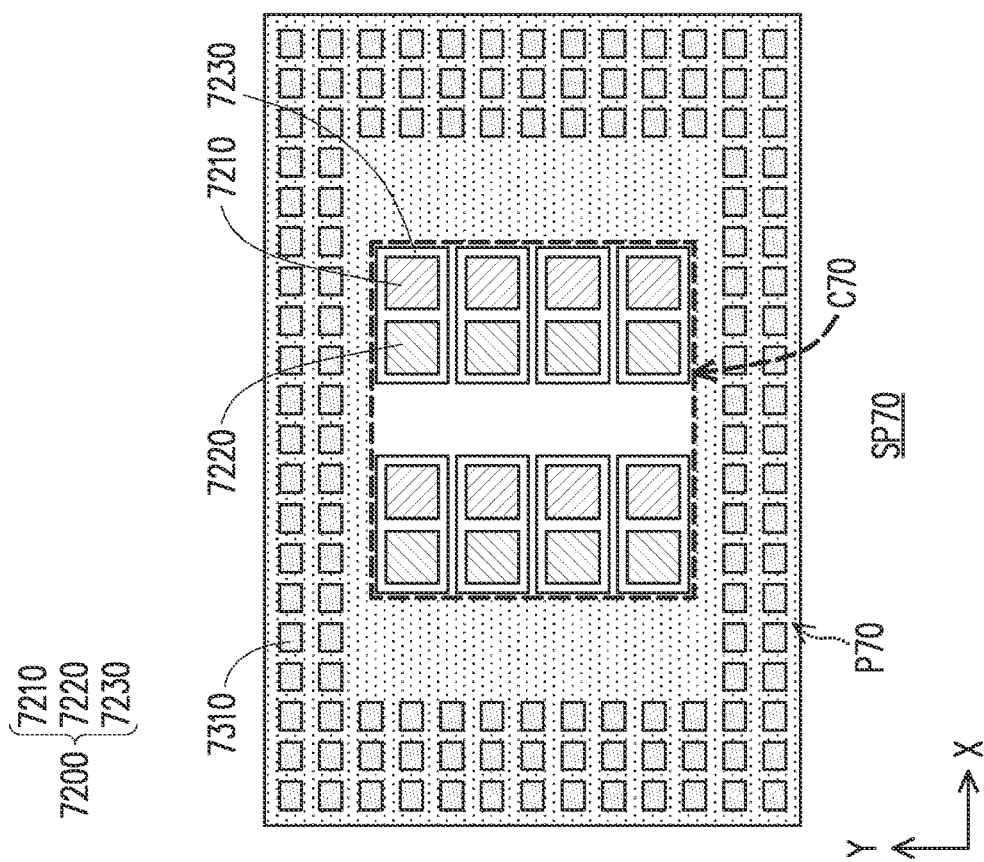
Figure 10D:
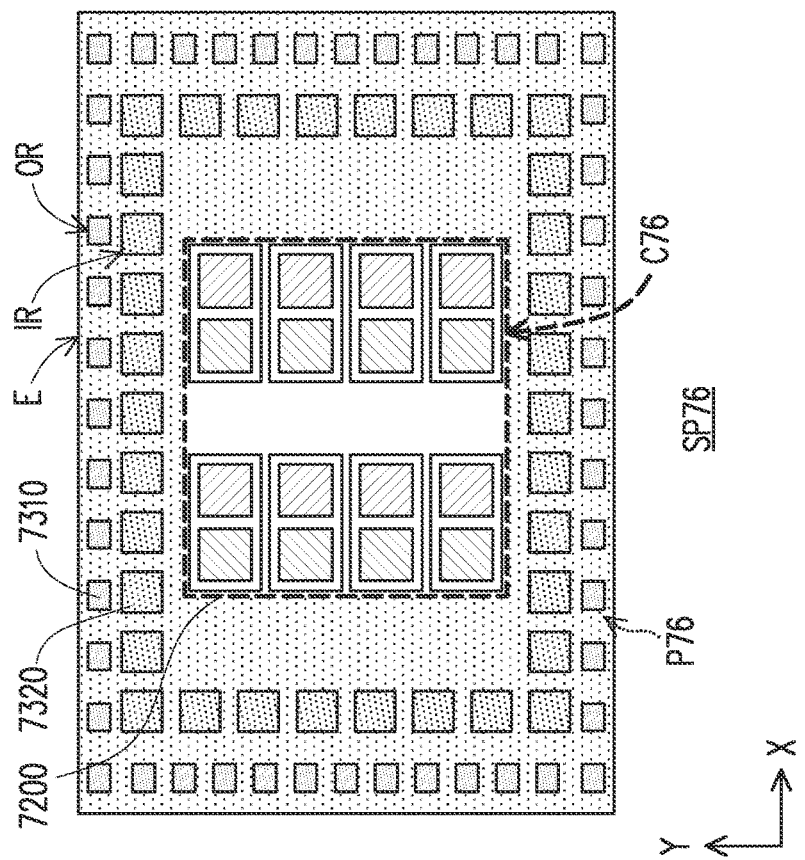
Figure 10C:
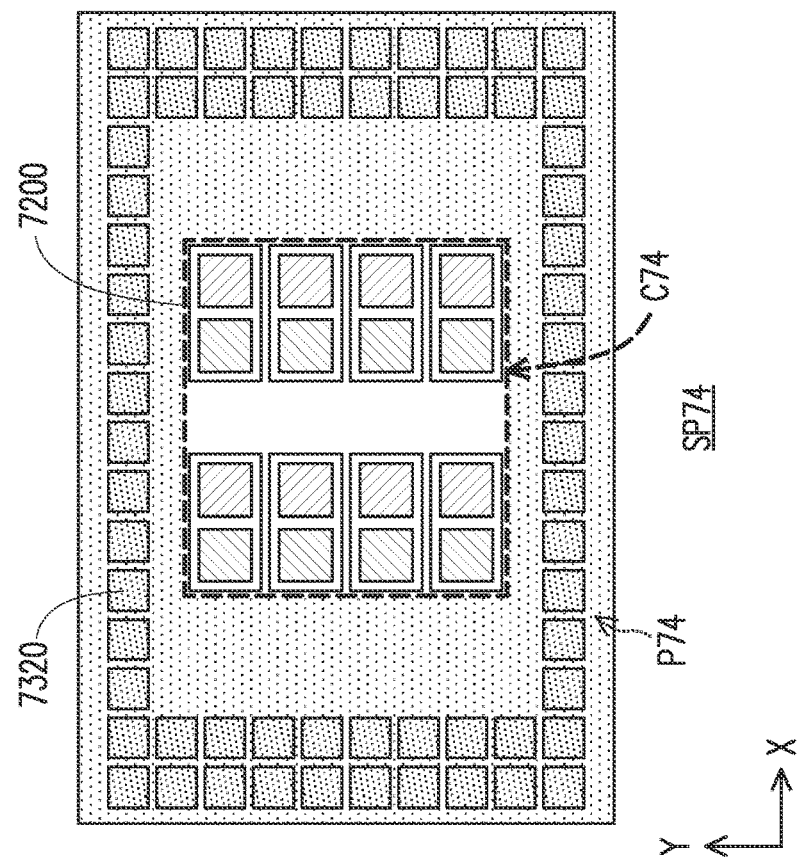
Figure 11:
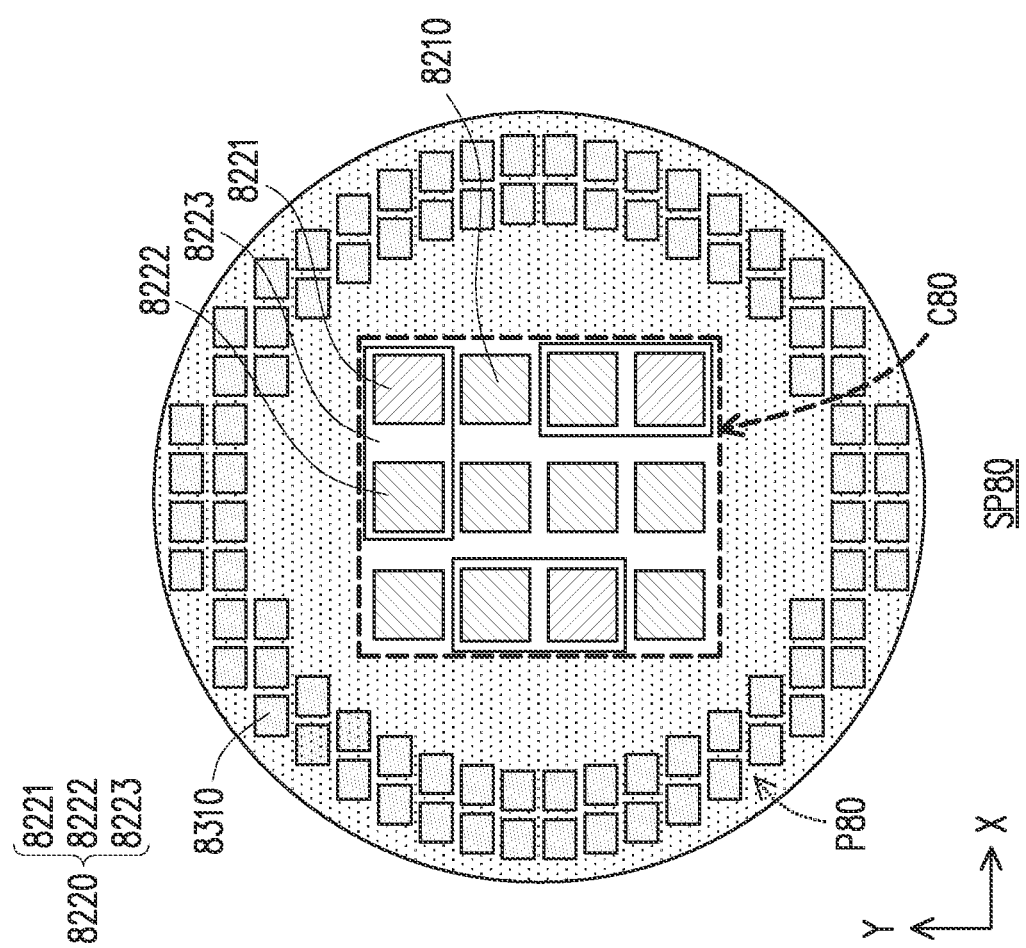

FIG. 6A to FIG. 6D are schematic cross-sectional views of the semiconductor packages SP30, SP32, SP34, SP36, respectively, according to some embodiments of the disclosure. The cross-sectional views of FIG. 6A to FIG. 6D are taken in the same XY plane as the cross-sectional views of FIG. 5A to FIG. 5D. In some embodiments, a difference between the semiconductor packages SP30, SP32, SP34, SP36 and the semiconductor packages SP20, SP22, SP24, SP26 of FIG. 5A to FIG. 5D lies in that the semiconductor packages SP30, SP32, SP34, SP36 are panel-size semiconductor packages, having a rectangular footprint. As illustrated in FIG. 6A, the semiconductor package SP30 includes the semiconductor die 3200 in the (rectangular) central region C30, and the dummy dies 3310 in the peripheral region P30. The dummy dies 3310 may be disposed in the peripheral region P30 surrounding the central region C30, for example forming one or more rings outside the central region C30. In some embodiments, the dummy dies 3310 may be confined within the peripheral region P30. That is, no dummy dies 3310 are included in the central region C30. However, the disclosure is not limited thereto, and in some alternative embodiments, dummy dies 3310 may be included in the central region C30.

Similar to what was previously discussed with respect to FIG. 5A to FIG. 5D, in some embodiments, when a single functional die such as the semiconductor die 3200 is included as in the semiconductor package SP30, the central region C30 may extend further than the span of the semiconductor die 3200. In some embodiments, the central region C30 may be circular (substantially round or elliptical, for example), or rectangular, and be centered on a central point C of the semiconductor package SP30. For example, for a panel-size semiconductor package as the semiconductor package SP30, the central point C may correspond to the intersection of the diagonals (dashed lines in FIG. 6A) of the footprint of the semiconductor package SP30. In some the central region C30 may be rectangular, and the diagonals of the central region C30 may intersect at the central point C of the semiconductor package SP30. In some alternative embodiments, the central region may be circular, and the center of the central region may be located at the central point C. In some yet alternative embodiments, the axes of an elliptical central region may intersect at the central point C. In some embodiments, the central region C30 may extend in between 5% to 50% of the total area of the semiconductor package SP30. For example, the area of the central region C30 may be 5%, 10%, 15%, 20%, 25%, 30%, 35%, 40%, 45% or 50% of the total area of the semiconductor package SP30. In some embodiments, the area of the central region C30 may be about 10% to 30% larger than the area of the single functional die 3200. For example, the area of the central region may be 10%, 15%, 20%, 25%, or 30% larger than the area of the single functional die 3200.

In some embodiments it may be possible to tune the vacancy ratios P32', P34', P36' of the peripheral regions P32, P34, P36 by varying the number and the size of the dummy dies 3310, similar to what was previously described with reference to FIG. 5B to FIG. 5D. For example, the semiconductor package SP32 includes fewer dummy dies 3310 further spaced apart from each other with respect to the dummy dies 3310 in the semiconductor package SP30. As another example, the semiconductor package SP34 includes fewer dummy dies 3320 with respect to the number of dummy dies 3310 included in the semiconductor package SP30. The dummy dies 3320 have a larger footprint with respect to the dummy dies 3310 included in the semiconductor packages SP30 and SP32. In yet another example, the semiconductor package SP36 includes both the dummy dies 3310 and the dummy dies 3320. For example, an outer (rectangular) ring OR (a frame) of smaller dummy dies 3310 may be disposed closer to the edge E of the semiconductor package SP36, and an inner (rectangular) ring IR (a frame) of larger dummy dies 3320 may be disposed between the outer ring OR and the border of the central region C36.

FIG. 7A to FIG. 7D are schematic cross-sectional views of the semiconductor packages SP40, SP42, SP44, SP46, respectively, according to some embodiments of the disclosure. The cross-sectional views of FIG. 7A to FIG. 7D are taken in the same XY plane as the cross-sectional views of FIG. 5A to FIG. 5D. In some embodiments, a difference between the semiconductor packages SP40, SP42, SP44, SP46 and the semiconductor packages SP20, SP22, SP24, SP26 of FIG. 5A to FIG. 5D lies in that the semiconductor packages SP40, SP42, SP44, SP46 includes multiple functional semiconductor dies 4200 within the central regions C40, C42, C44, C46. The sizes and functions of the semiconductor dies 4200 may independently vary with respect to each other. As illustrated, for example, in FIG. 7A, the semiconductor package SP40 is a wafer-size semiconductor package including the semiconductor die 4200 in the central region C40, and the dummy dies 4310 in the peripheral region P40. In some embodiments, the central region C40 may be defined based on the outer surfaces 4200s of the outermost semiconductor dies 4200, similar to what was previously discussed with reference to FIG. 4A. The dummy dies 4310 may be disposed in the peripheral region P40 surrounding the central region C40, for example forming one or more rings outside the central region C40. In some embodiments, additional dummy dies (not shown) not necessarily identical to the dummy dies 4310 may be disposed within the central region C40. Similar to what was previously discussed with respect to FIG. 5A to FIG. 5D, in some embodiments it may be possible to tune the vacancy ratios P42', P44', P46' of the peripheral regions P42, P44, P46 by varying the number and the size of the dummy dies 3310. For example, the semiconductor package SP42 includes fewer dummy dies 4310 further spaced apart from each other with respect to the dummy dies 4310 in the semiconductor package SP40. As another example, the semiconductor package SP44 includes fewer dummy dies 4320 than the number of dummy dies 4310 in the semiconductor package SP40. The dummy dies 4320 have a larger footprint with respect to the dummy dies 3310 included in the semiconductor packages SP40 and SP42. In yet another example, the semiconductor package SP46 includes both the dummy dies 4310 and the dummy dies 4320. For example, an outer (circular) ring (a frame) OR of smaller dummy dies 4310 may be disposed closer to the edge E of the semiconductor package SP46, and an inner (circular) ring (a frame) IR of larger dummy dies 4320 may be disposed between the outer ring OR and the border of the central region C46.

FIG. 8A to FIG. 8D are schematic cross-sectional views of the semiconductor packages SP50, SP52, SP54, SP56, respectively, according to some embodiments of the disclosure. The cross-sectional views of FIG. 8A to FIG. 8D are taken in an XY plane corresponding to the XY plane of the cross-sectional views of FIG. 6A to FIG. 6D. In some embodiments, a difference between the semiconductor packages SP50, SP52, SP54, SP56 and the semiconductor packages SP30, SP32, SP34, SP36 of FIG. 6A to FIG. 6D lies in that the semiconductor packages SP50, SP52, SP54, SP56 include multiple functional semiconductor dies 5200 within the central regions C50, C52, C54, C56. The sizes and functions of the semiconductor dies 5200 may independently vary with respect to each other. As illustrated, for example, in FIG. 8A, the semiconductor package SP50 is a panel-size semiconductor package including the semiconductor die 5200 in the (rectangular) central region C50, and the dummy dies 5310 in the peripheral region P50. The dummy dies 5310 may be disposed in the peripheral region P50 surrounding the central region C50, for example forming one or more rings outside the central region C50. In some embodiments, additional dummy dies (not shown) not necessarily identical to the dummy dies 5310 may be disposed within the central region C50. Similar to what was previously discussed with respect to FIG. 6A to FIG. 6D, in some embodiments it may be possible to tune the vacancy ratios P52', P54', P56' of the peripheral regions P52, P54, P56 by varying the number and the size of the dummy dies 5310. For example, the semiconductor package SP52 includes fewer dummy dies 5310 further spaced apart from each other with respect to the dummy dies 5310 in the semiconductor package SP50. As another example, the semiconductor package SP54 includes fewer dummy dies 5320 than the number of dummy dies 5310 in the semiconductor package SP50. The dummy dies 5320 have a larger footprint with respect to the dummy dies 5310 included in the semiconductor packages SP50 and SP52. In yet another example, the semiconductor package SP56 includes both the dummy dies 5310 and the dummy dies 5320. For example, an outer (circular) ring (a frame) OR of smaller dummy dies 5310 may be disposed closer to the edge E of the semiconductor package SP56, and an inner (circular) ring (a frame) IR of larger dummy dies 5320 may be disposed between the outer ring OR and the border of the central region C56.

FIG. 9A to FIG. 9D are schematic cross-sectional views of the wafer-size semiconductor packages SP60, SP62, SP64, SP66, respectively, according to some embodiments of the disclosure. The cross-sectional views of FIG. 9A to FIG. 9D are taken in an XY plane corresponding to the XY plane of the cross-sectional views of FIG. 5A to FIG. 5D. In some embodiments, a difference between the semiconductor packages SP60, SP62, SP64, SP66 and the semiconductor packages SP20, SP22, SP24, SP26 of FIG. 5A to FIG. 5D lies in that the semiconductor packages SP60, SP62, SP64, SP66 includes one or more sub-packages 6200 within the central regions C60, C62, C64, C66. In some embodiments, each one of the sub-packages 6200 includes one or more semiconductor dies 6210, 6220 encapsulated by an encapsulant 6230. In some embodiments, the semiconductor dies 6210, 6220 included in a same sub-package 6200 may be interconnected to each other by a redistribution layer (not shown) included in the sub-package 6200. The sub-packages 6200, in turn, may be interconnected to each other by the redistribution structures (not illustrated) of the corresponding semiconductor packages SP60, SP62, SP64, SP66 (e.g., similar to what was discussed with respect to the semiconductor dies 1200 and the redistribution structure 1600 for the semiconductor package SP10 of FIG. 4A). The size, number, and function of the semiconductor dies 6210, 6220 included in the sub-packages 6200 may independently vary, and the disclosure does not pose any restriction in this regard. As illustrated, for example, in FIG. 9A, the semiconductor package SP60 is a wafer-size semiconductor package including the sub-packages 6200 in the central region C60, and the dummy dies 6310 in the peripheral region P60. In some embodiments, the central region C60 may be defined with respect to the outer surfaces 6200s of the (outermost) sub-packages 6200, similarly to what was previously discussed with respect to the central region C10 with reference to FIG. 4A. The dummy dies 6310 may be disposed in the peripheral region P60 surrounding the central region C60, forming one or more rings outside the central region C60. In some embodiments, additional dummy dies (not shown) not necessarily identical to the dummy dies 6310 may be disposed within the central region C60. In some embodiments, the dummy dies 6310 and the sub-packages 6200 are encapsulated by a common encapsulant 6400. The encapsulant 6230 of the sub-packages 6200 and the encapsulant 6400 may include different materials (e.g., different resins). However, the disclosure is not limited thereto. In some alternative embodiments, the encapsulant 6230 of the sub-packages 6200 and the encapsulant 6400 may include the same material. Similar to what was previously discussed with respect to FIG. 5A to FIG. 5D, in some embodiments it may be possible to tune the vacancy ratios P62', P64', P66' of the peripheral regions P62, P64, P66 by varying the number and the size of the dummy dies 6310. For example, the semiconductor package SP62 includes fewer dummy dies 6310 further spaced apart from each other with respect to the dummy dies 6310 in the semiconductor package SP60. As another example, the semiconductor package SP64 includes fewer dummy dies 6320 than the number of dummy dies 6310 included in the semiconductor package SP60. The dummy dies 6320 have a larger footprint with respect to the dummy dies 6310 included in the semiconductor packages SP60 and SP62. In yet another example, the semiconductor package SP66 includes both the dummy dies 6310 and the dummy dies 6320. For example, an outer (circular) ring OR (a frame) of smaller dummy dies 6310 may be disposed closer to the edge E of the semiconductor package SP66, and an inner (circular) ring IR (a frame) of larger dummy dies 6320 may be disposed between the outer ring OR and the border of the central region C66.

FIG. 10A to FIG. 10D are schematic cross-sectional views of the panel-size semiconductor packages SP70, SP72, SP74, and SP76, respectively, according to some embodiments of the disclosure. The cross-sectional views of FIG. 10A to FIG. 10D are taken in an XY plane corresponding to the XY plane of the cross-sectional views of FIG. 6A to FIG. 6D. In some embodiments, a difference between the semiconductor packages SP70, SP72, SP74, and SP76 with respect to the semiconductor packages SP30, SP32, SP34, SP36 of FIG. 6A to FIG. 6D lies in that the semiconductor packages SP70, SP72, SP74, and SP76 include one or more sub-packages 7200 within the central regions C70, C72, C74, C76. Similar to the sub-packages 6200, each sub-package 7200 includes one or more semiconductor dies 7210, 7220 encapsulated by an encapsulant 7230. The size, number, and function of the semiconductor dies 7210, 7220 included in the sub-packages 7200 may independently vary, and the disclosure does not pose any restriction in this regard. As illustrated, for example, in FIG. 10A, the semiconductor package SP70 is a panel-size semiconductor package including the sub-packages 7200 in the central region C70, and the dummy dies 7310 in the peripheral region P70. The dummy dies 7310 may be disposed in the peripheral region P70 surrounding the central region C70, forming one or more rings outside the central region C70. In some embodiments, additional dummy dies (not shown) not necessarily identical to the dummy dies 7310 may be disposed within the central region C70. Similar to what was previously discussed with respect to FIG. 6A to FIG. 6D, in some embodiments it may be possible to tune the vacancy ratios P72', P74', P76' of the peripheral regions P72, P74, P76 by varying the number and the size of the dummy dies 7310. For example, the semiconductor package SP72 includes fewer dummy dies 7310 further spaced apart from each other with respect to the dummy dies 7310 in the semiconductor package SP70. As another example, the semiconductor package SP74 includes fewer dummy dies 7320 than the number of dummy dies 7310 included in the semiconductor package SP70. The dummy dies 7320 have a larger footprint with respect to the dummy dies 7310 included in the semiconductor packages SP70 and SP72. In yet another example, the semiconductor package SP76 includes both the dummy dies 7310 and the dummy dies 7320. For example, an outer (rectangular) ring OR (a frame) of smaller dummy dies 7310 may be disposed closer to the edge E of the semiconductor package SP76, and an inner (circular) ring IR (a frame) of larger dummy dies 7320 may be disposed between the outer ring OR and the border of the central region C76.

Figure 11:
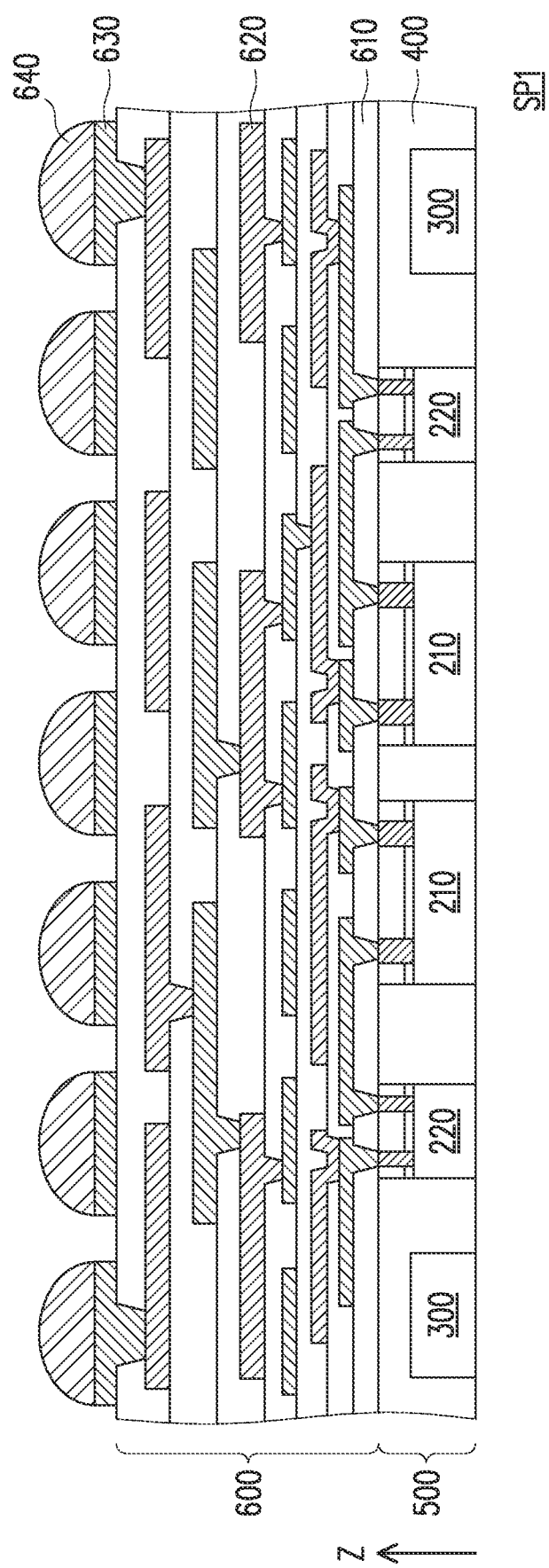
FIG. 11 is a schematic cross-sectional view of a semiconductor package according to some embodiments of the present disclosure.

FIG. 11 is a schematic cross-sectional view of the wafer-size semiconductor package SP80 according to some embodiments of the disclosure. The cross-sectional view of FIG. 11 is taken in an XY plane corresponding to the XY plane of the cross-sectional views of FIG. 5A. In some embodiments, a difference between the semiconductor packages SP80 and the semiconductor packages SP20 of FIG. 5A lies in that the semiconductor package SP80 includes both the (bare) semiconductor dies 8210 and the sub-packages 8220 within the central region C80. In some embodiments, each one of the sub-packages 8220 includes one or more semiconductor dies 8221, 8222 encapsulated by an encapsulant 8223. The size, number, and function of the bare semiconductor dies 8210, of sub-packages 8220, and of the semiconductor dies 8221, 8222 included in each sub-package 8220 may independently vary, and the disclosure does not pose any restriction in this regard. As illustrated, for example, in FIG. 11, the semiconductor package SP80 is a wafer-size semiconductor package including the bare semiconductor dies 8210 and the sub-packages 8220 disposed side by side within the central region C80. The dummy dies 8310 are disposed in the peripheral region P80, for example forming one or more rings surrounding the central region C80. In some embodiments, additional dummy dies (not shown) not necessarily identical to the dummy dies 8310 may be disposed within the central region C80. In some embodiments, it may be possible to tune the vacancy ratio P80' of the peripheral region P80 by varying the number and the size of the dummy dies 8310 in a similar fashion as previously described with reference to FIG. 5A to FIG. 5D.

In accordance with some embodiments of the disclosure, a semiconductor package has a central region and a peripheral region. The peripheral region surrounds the central region. The semiconductor package includes dies, an encapsulant, and a redistribution structure. The dies include a functional die and first dummy dies. The functional die is disposed in the central region. The first dummy dies are disposed in the peripheral region. The redistribution structure is disposed on the encapsulant over the dies, and is electrically connected to the functional die. A vacancy ratio of the central region is in the range from 1.01 to 3.00. A vacancy ratio of the peripheral region is in the range from 1.01 to 3.00. The vacancy ratio of the central region is a ratio of a total area of the central region to a total area occupied by the dies disposed in the central region. The vacancy ratio of the peripheral region is a ratio of a total area of the peripheral region to a total area occupied by the first dummy dies disposed in the peripheral region.

In accordance with some embodiments of the disclosure, a semiconductor package has a central region and a peripheral region. The peripheral region is disposed around the central region and extends from the central region to an edge of the semiconductor package. The semiconductor package includes first dies, second dies, an encapsulant, and a redistribution structure. The first dies are disposed in the central region. The second dies are disposed in the peripheral region. The encapsulant encapsulates the first dies and the second dies. The redistribution structure is disposed over the encapsulant. The redistribution structure includes conductive traces. The first dies include first functional dies electrically connected to the conductive traces of the redistribution structure. A border between the peripheral region and the central region passes on outer surfaces of outermost first functional dies. The outermost first functional dies are first functional dies radially closer to the edge of the semiconductor package amongst the first functional dies. The outer surfaces are surfaces facing the edge of the semiconductor package without other first functional dies interposed with respect to the edge. A ratio of a total area of the central region to a total area of the peripheral region multiplied by a ratio of a total area occupied by the second dies in the peripheral region to a total area occupied by the first dies in the central region is in the range between 0.3 to 3.0.

In accordance with some embodiments of the disclosure, a manufacturing method of a semiconductor package includes the following steps. First dies are disposed on a carrier. Second dies are disposed on the carrier beside the first dies. The first dies and the second dies are molded in an encapsulant. Dielectric layers and metallization tiers are formed alternately stacked on the encapsulant. The metallization tiers comprise conductive traces electrically contacting at least one die of the first dies. The first dies are disposed in a first region of the semiconductor package. The second dies are disposed in a second region of the semiconductor package. In the semiconductor package, a first ratio of a total area of a first region to a total area occupied by the first dies is in the range from 1.01 to 3.00. A second ratio of a total area of a second region to a total area occupied by the second dies is in the range from 1.01 to 3.00. A combined area of the total area of the first region and the total area of the second region coincides with a total area of the semiconductor package. A third ratio of the first ratio to the second ratio is in the range from 0.3 to 3.0.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, having a central region and a peripheral region surrounding the central region, the semiconductor package comprising:
dies, wherein the dies include:
a functional die disposed in the central region; and
first dummy dies disposed in the peripheral region; and
an encapsulant encapsulating the dies,
wherein the encapsulant is a first encapsulant, the functional die is one of a pair of functional dies, the pair of functional dies is encapsulated by a second encapsulant different from the first encapsulant in a sub-package, and the sub-package is encapsulated by the first encapsulant, and
wherein a size of the functional dies is different from a size of the first dummy dies.

2. The semiconductor package of claim 1, wherein a vacancy ratio of the central region is different from a vacancy ratio of the peripheral region.

3. The semiconductor package of claim 2, wherein a ratio of the vacancy ratio of the central region to the vacancy ratio of the peripheral region is in the range from 0.3 to 3.0.

4. The semiconductor package of claim 1, further comprising bare semiconductor dies within the central region.

5. The semiconductor package of claim 1, wherein the dies include multiple pairs of functional dies.

6. The semiconductor package of claim 5,
wherein the multiple pairs of functional dies are arranged in an array.

7. The semiconductor package of claim 6, wherein a border between the central region and the peripheral region coincides with a perimeter of the array.

8. A semiconductor package, having a central region and a peripheral region disposed around the central region and extending from the central region to an edge of the semiconductor package, the semiconductor package comprising:
first dies disposed in the central region;
second dies disposed in the peripheral region; and
an encapsulant, encapsulating the first dies and the second dies,
wherein the first dies comprise first functional dies,
wherein the first functional dies are disposed along rows and columns of an array, and the first dies further include first dummy dies disposed along intersecting lines in between adjacent rows and columns of the first functional dies, and
wherein the second dies comprise second dummy dies and third dummy dies, and a footprint of the second dummy dies is different from a footprint of the third dummy dies.

9. The semiconductor package of claim 8, wherein the footprint of the second dummy dies is larger than the footprint of the third dummy dies.

10. The semiconductor package of claim 8, wherein the third dummy dies are disposed along the edge of the semiconductor package, and the second dummy dies are disposed as a ring between the third dummy dies and the outermost first functional dies.

11. The semiconductor package of claim 8, wherein a through hole space is present at an intersection between two intersecting lines perpendicular to each other.

12. The semiconductor package of claim 11, wherein no die is disposed at the through hole space.

13. The semiconductor package of claim 8, wherein a ratio of a radial width of the central region to a radial width of the peripheral region is in the range from 0.5 to 2.0.

14. The semiconductor package of claim 8, wherein at least one first functional die is a passive device.

15. A manufacturing method of a semiconductor package, the method comprising:
disposing first dies on a carrier;
disposing second dies on the carrier beside the first dies; and
molding the first dies and the second dies in an encapsulant;
wherein, in the semiconductor package,
the first dies are disposed in a first region of the semiconductor package;
the second dies are disposed in a second region of the semiconductor package;
wherein the first dies include third dies and fourth dies, and
wherein disposing the first dies comprises:
disposing the third dies on the carrier along rows and columns of an array; and
disposing the fourth dies in between the rows and columns of the array,
wherein a border between the first region and the second region is delimited by a perimeter of the array, and
wherein the second dies comprise dummy dies with two different sizes.

16. The manufacturing method of claim 15, further comprising:
forming alternately stacked dielectric layers and metallization tiers on the encapsulant, wherein the metallization tiers comprise conductive traces electrically contacting the third dies of the first dies.

17. The manufacturing method of claim 16, wherein the fourth dies of the first dies are electrically insulated from the metallization tiers.

18. The manufacturing method of claim 16, further comprising disposing connective terminals on an opposite side of the stacked dielectric layers and metallization tiers with respect to the first dies.

19. The manufacturing method of claim 15, wherein a first ratio of a total area of the first region to a total area occupied by the first dies is in the range from 1.01 to 3.00.

20. The manufacturing method of claim 15, wherein a second ratio of a total area of the second region to a total area occupied by the second dies is in the range from 1.01 to 3.00.

* * * * *